(12) United States Patent
Shionoiri et al.

(10) Patent No.: US 7,319,633 B2
(45) Date of Patent: Jan. 15, 2008

(54) SEMICONDUCTOR DEVICE

(75) Inventors: Yutaka Shionoiri, Isehara (JP);
Tomoaki Atsumi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/013,426

(22) Filed: Dec. 17, 2004

(65) Prior Publication Data

US 2005/0135181 A1 Jun. 23, 2005

(30) Foreign Application Priority Data

Dec. 19, 2003 (JP) .............................. 2003-423752

(51) Int. Cl.
*G11C 8/00* (2006.01)
(52) U.S. Cl. .................. 365/230.06; 365/226
(58) Field of Classification Search ........... 365/230.06, 365/226
See application file for complete search history.

(56) References Cited

U.S. PATENT DOCUMENTS

| | | | |
|---|---|---|---|
| 5,297,029 A | | 3/1994 | Nakai et al. |
| 5,406,521 A | * | 4/1995 | Hara ....................... 365/185.25 |
| 5,428,568 A | * | 6/1995 | Kobayashi et al. .... 365/185.24 |
| 5,488,384 A | * | 1/1996 | Uehara et al. ............... 345/3.1 |
| 5,592,430 A | * | 1/1997 | Ohtsuki ....................... 365/226 |
| 5,638,323 A | * | 6/1997 | Itano ....................... 365/185.22 |
| 6,339,549 B1 | * | 1/2002 | Jinbo et al. ............ 365/185.33 |
| 6,741,487 B2 | | 5/2004 | Yokozeki |
| 2001/0030323 A1 | | 10/2001 | Ikeda |
| 2002/0003956 A1 | * | 1/2002 | Inagaki ......................... 396/89 |
| 2003/0117842 A1 | * | 6/2003 | Hanzawa et al. ...... 365/185.02 |
| 2004/0080986 A1 | * | 4/2004 | Hanzawa et al. ...... 365/189.02 |
| 2005/0047266 A1 | | 3/2005 | Shionoiri et al. |

FOREIGN PATENT DOCUMENTS

| | | |
|---|---|---|
| JP | 05-166381 | 7/1993 |
| JP | 06-020484 | 1/1994 |
| JP | 07-065594 | 3/1995 |

\* cited by examiner

*Primary Examiner*—Thong Q. Le
(74) *Attorney, Agent, or Firm*—Eric J. Robinson; Robinson Intellectual Property Law Office, P.C.

(57) ABSTRACT

A semiconductor device in which a current consumption when a word line being selected is suppressed and accurate data reading is carried out. The semiconductor device of a semiconductor device of the invention comprises a data storage means and a power source control means. The data storage means has a plurality of memory cells. The power source control means has at least one power source line and a plurality of switches. In addition, the invention further comprises an address selection means having a selector circuit including a plurality of switches and an output bus, a first decoder circuit for selecting the switch in the selector circuit, and a second decoder circuit.

26 Claims, 16 Drawing Sheets

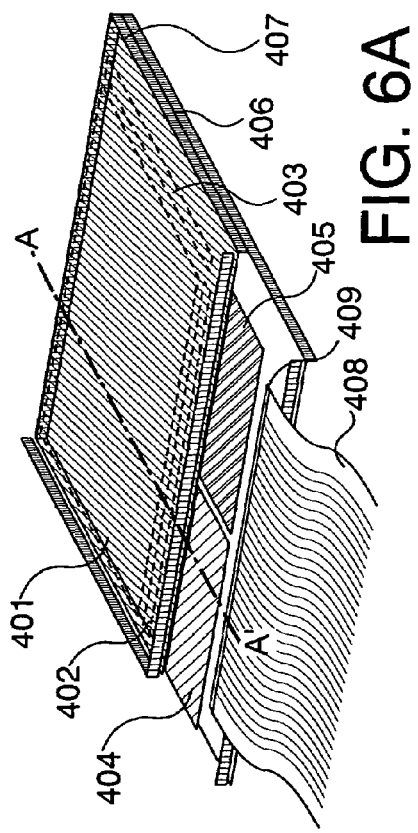
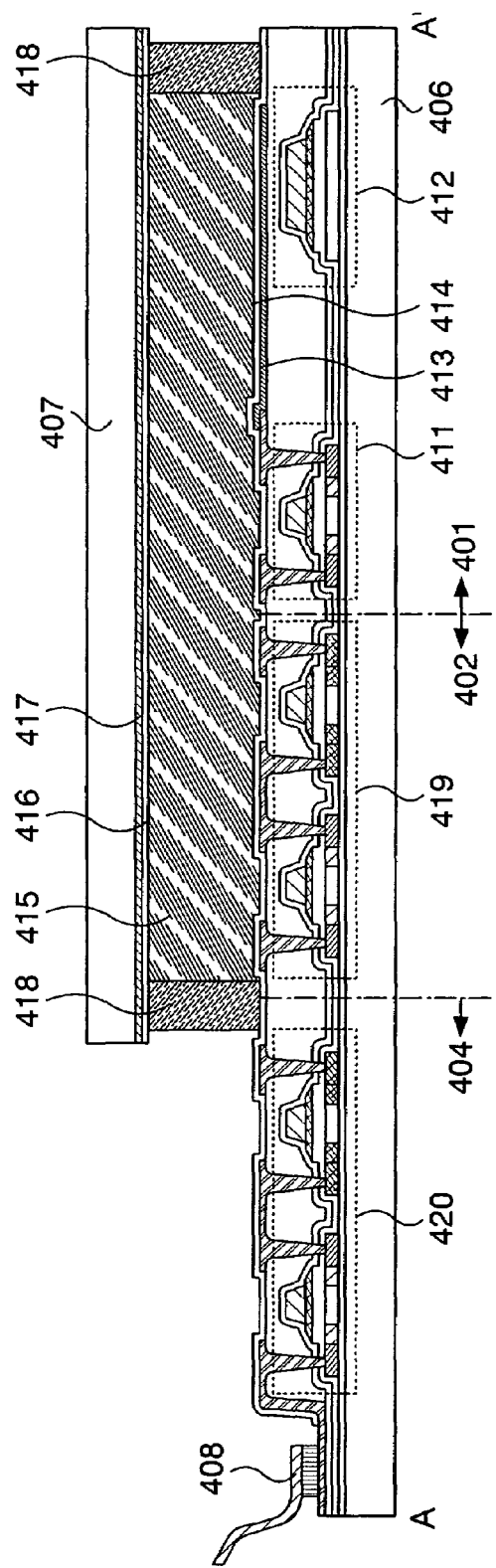
FIG. 6A
FIG. 6B

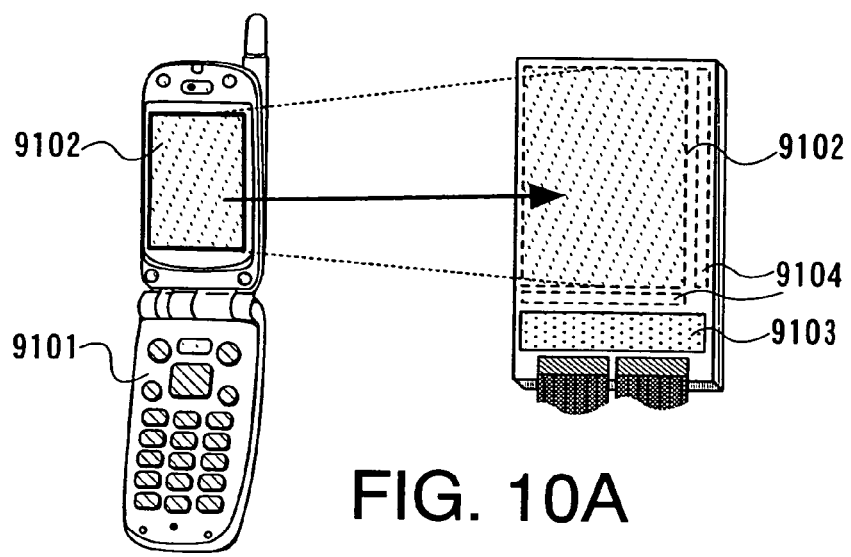
FIG. 10A
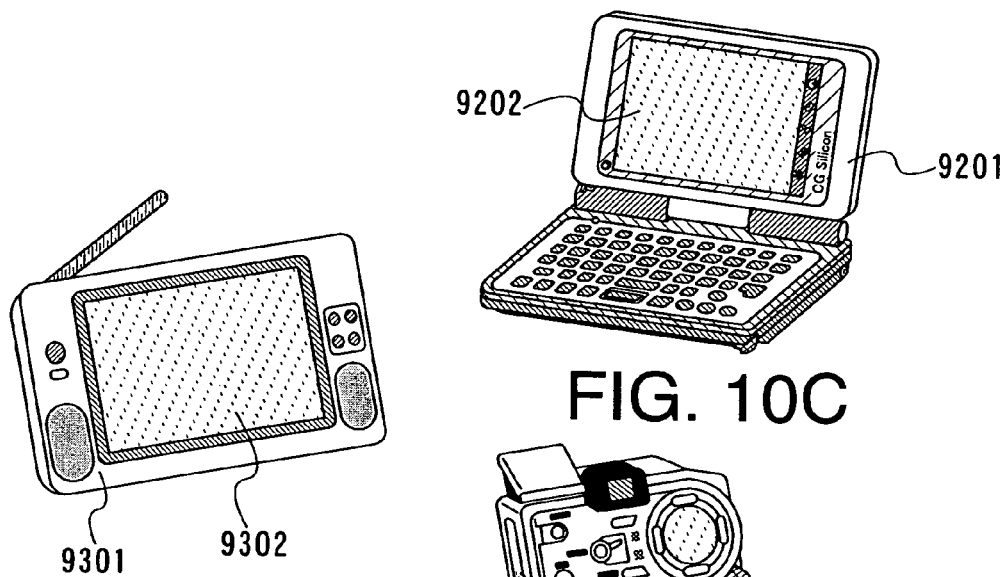
FIG. 10C
FIG. 10B
FIG. 10D
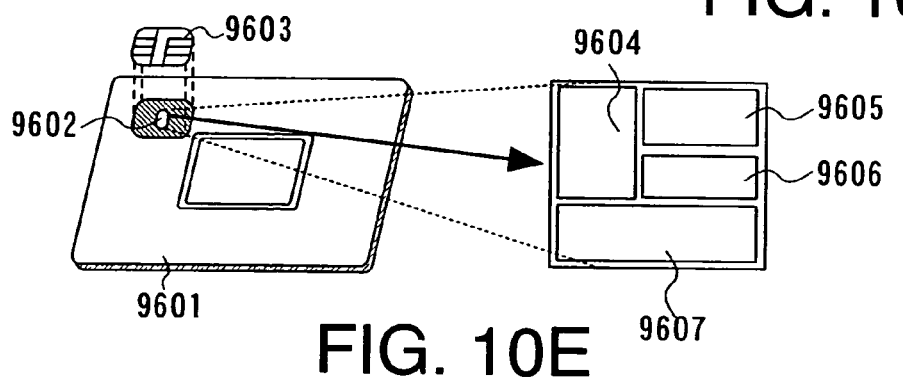
FIG. 10E

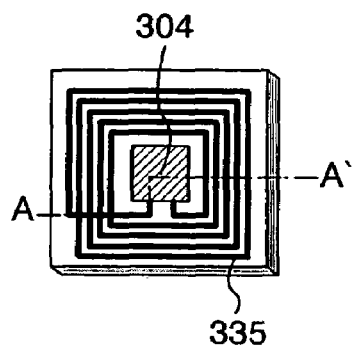 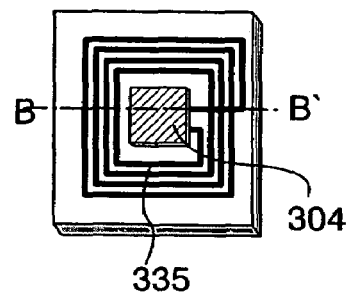
FIG. 11A  FIG. 11B
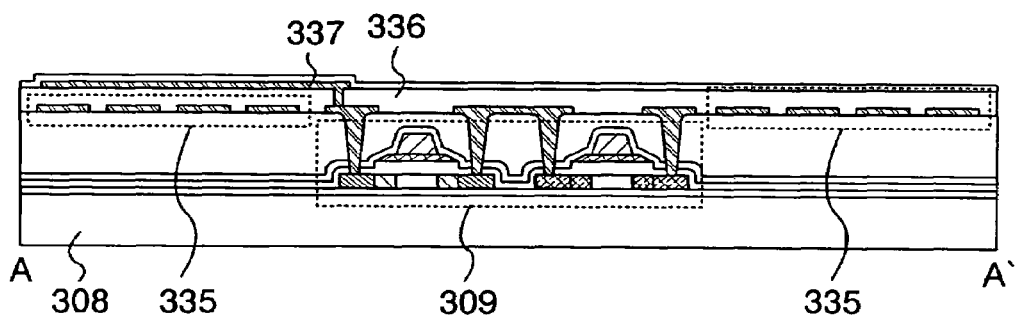
FIG. 11C
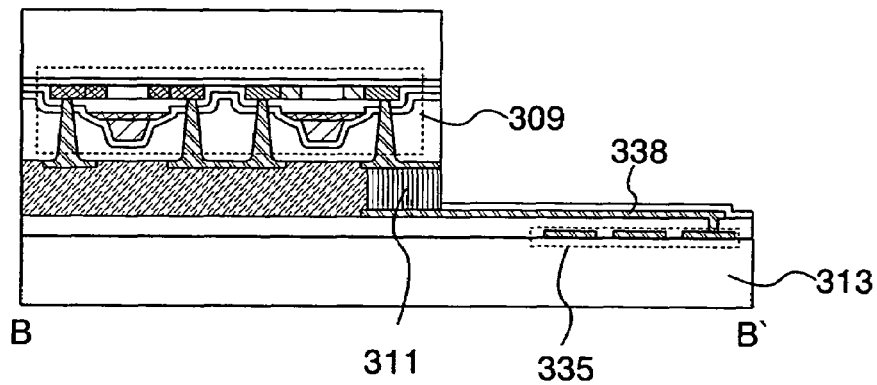
FIG. 11D

SEMICONDUCTOR DEVICE

BACKGROUND OF THE INVENTION

1. Field of the Invention

The present invention relates to a semiconductor device having a semiconductor element. In addition, the invention relates to a semiconductor device which is capable of wireless data communication (hereinafter referred to as an ID tag).

2. Description of the Related Art

In recent years, a semiconductor device having a semiconductor element has been applied to various fields such as an electronic apparatus including a high performance personal computer and a portable information terminal, an IC card, and an ID tag, and developed to have higher capacity in accordance with the achievement of a higher-speed operation of a CPU (Central Processing Unit) included in the electronic apparatus, increase in the amount of process data and the amount of store data in an IC card and the like.

The semiconductor device having a semiconductor element as shown in FIG. 4 generally comprises a storage means (a memory cell array) 11 having memory cells 13 each including a memory element which is arranged in a plurality of regions where a bit line Bx ($1 \leq x \leq m$, m is a positive integer) and a word line Wy ($1 \leq y \leq n$, n is a positive integer; a row address selection line) cross each other with an insulator interposed therebetween, a selector circuit 14 including switches SWx ($1 \leq x \leq m$, m is a positive integer) connecting to the bit lines respectively, a first decoder circuit 15 for selecting the switch in the selector circuit 14, and a second decoder circuit 16 for selecting the word line (see FIG. 4).

In a ROM (Read Only Memory, a memory dedicated to data reading) particularly, one transistor serves as the aforementioned memory element in many cases. Electrodes (a gate electrode, a source electrode, and a drain electrode) of the transistor are connected as follows: the gate electrode is connected to the word line, one of the source electrode and the drain electrode is connected to the bit line, and the other is connected to a high voltage power source line (VDD) 22 and a low voltage power source line (VSS) 23.

For example, in FIG. 5, as for a transistor as a memory element 18 in a memory cell, a gate electrode is connected to the word line W1, one of a source electrode and a drain electrode is connected to the bit line B1, and the other is connected to a high voltage power source line (VDD) 22. In such a case, the memory cell stores data of Hi level (1).

On the other hand, as for a transistor as a memory element 19 in a memory cell, a gate electrode is connected to the word line W1, one of a source electrode and a drain electrode is connected to the bit line B2, and the other is connected to a low voltage power source line (VSS) 23. In such a case, the memory cell stores data of Lo level (0).

Data may be stored in the following manners as well: data of Hi level (1) is stored when a high voltage power source line (VDD) being connected whereas data of Lo level (0) is stored when no transistor is provided, data of Hi level (1) is stored when a high voltage power source line (VDD) being connected whereas data of Lo level (0) is stored when a power source line being not connected, data of Lo level (0) is stored when a low voltage power source line (VSS) being connected whereas data of Hi level (1) is stored when no transistor is provided, and data of Lo level (0) is stored when a low voltage power source line (VSS) being connected whereas data of Hi level (1) is stored when a power source line being not connected.

The case of data reading in a ROM is briefly described below (see FIG. 5). One of the switches SW1 to SWm in the selector circuit 14 is selected by the first decoder circuit 15, and one of the bit lines Bx, which is connected to a source electrode or a drain electrode of a transistor as a memory element in a memory cell is selected. When the switch is selected, the selected bit line is connected to an output bus 12 (that is, current flows). In addition, one of the word lines, which is connected to a gate electrode of a transistor as a memory element in a memory cell, is selected by the second decoder circuit 16.

Selected in this manner is only a memory cell in a region where the bit line and the word line, which are selected by the first and second decoder circuits 15 and 16 and the selector circuit 14, cross each other through an insulator. That is, a bit line is connected to a drain electrode or a source electrode of a transistor as a memory element in the memory cell, and then data corresponding to the connection state is read out by the output bus 12 which is connected to the bit line. For example, when a memory cell including the transistor 19 as a memory element is selected by the first and second decoder circuits 15 and 16 and the selector circuit 14, a bit line B2 which is connected to one of the source electrode and the drain electrode of the transistor 19 is connected to the low voltage power source line (VSS) 23 which is connected to the other of the source electrode and the drain electrode, and then data of Lo level (0) of the low voltage power source line (VSS) 23 is read out by the output bus 12 which is connected to the bit line B2.

The case of data reading in the ROM is briefly described above. Each word line selected by the second decoder circuit 16 is connected to not only a gate electrode of a transistor in a memory cell to be read data but also to each gate electrode of a plurality of transistors. Therefore, the state between each source electrode and each drain electrode of the transistors is conductive at the same time. As described above, one of a drain electrode and a source electrode of a transistor is generally connected to a power source line such that data in the memory cell is shown. Thus, the conductive state between each source electrode and each drain electrode of the plurality of transistors at the same time results in an unnecessary current flowing to the power source line, leading to a large current consumption. As a semiconductor device including memory elements for storing data has been developed to have higher capacity, the memory cell array 11 having memory cells 13 each including the memory element occupies a larger area of a chip and the number of transistors connected to one word line selected for reading data is increased, that is, the amount of unnecessary current flowing to a power source line upon selecting the word line is increased and a current consumption is increased.

In addition, when a current consumption is increased, voltage drop of a power source may occur and accurate data reading may not be carried out.

SUMMARY OF THE INVENTION

In view of the foregoing problems, the invention provides a semiconductor device having a semiconductor element including an ID tag in which a current consumption upon selecting a word line is suppressed and accurate data reading is carried out.

In order to solve the foregoing problems, the invention provides a semiconductor device having the following configuration including an ID tag.

A semiconductor device of the invention comprises a data storage means and a power source control means. In addition to the two factors, a semiconductor device of the invention comprises one or both of an address selection means having a selector circuit including a plurality of switches and an output bus, a first decoder circuit for selecting the switch in the selector circuit, and a second decoder circuit, and a display means having a plurality of pixels.

In the data storage means, each memory cell includes a memory element in a region where a bit line and a word line cross each other through an insulator. The memory element is formed by a transistor. Alternatively, the memory element may be formed by at least one of a capacitor and a resistor.

The power source control means for controlling power supply to the data storage means (memory cell array) comprises a high voltage power source line (VDD), a low voltage power source line (VSS), and a plurality of switches. Each switch is formed by a switching element typified by one or a plurality of transistors. Each switch is provided between the high voltage power source line (VDD) and first power source lines in the data storage means (memory cell array) each connected to the high voltage power source line (VDD), and between the low voltage power source line (VSS) and second power source lines in the data storage means (memory cell array) each connected to the low voltage power source line (VSS). Input nodes of the switches are connected to address selection lines respectively. That is, the switch controls connection or non-connection between the first power source line and the high voltage power source line (VDD) or between the second power source line and the low voltage power source line (VSS) through the address selection line. Note that in the case where the switch is a transistor, a gate electrode of the transistor corresponds to the input node. In the case where the switch is an analog switch, which is formed of an N-channel transistor and a P-channel transistor, gate electrodes of an N-channel transistor and a P-channel transistor, which configures the analog switch, correspond to the input node.

An ID tag according to a semiconductor device of the invention comprises a memory means including a data storage means and a power source control means, a control means, a power source generation means, and a transmission and reception means. In addition, an ID tag according to a semiconductor device of the invention comprises a memory means including a data storage means, a power source control means and an address selection means, a control means, a power source generation means, and a transmission and reception means.

The semiconductor device of the invention comprising a data storage means and a power source control means enables reduction in current consumption and an accurate data reading. Furthermore, according to the semiconductor device of the invention comprising one or both of an address selection means having a selector circuit including a plurality of switches and an output bus, a first decoder circuit for selecting the switch in the selector circuit, and a second decoder circuit, and a display means having a plurality of pixels, in addition to a data storage means and a power source control means, a multifunctional semiconductor device with high added value can be provided.

BRIEF DESCRIPTION OF THE DRAWINGS

FIGS. 6A and 6B are diagrams illustrating Embodiment Mode 2 of the invention.

FIGS. 10A to 10E are views illustrating Embodiment 1 of the invention.

FIGS. 11A to 11D are diagrams illustrating Embodiment Mode 3 of the invention.

DETAILED DESCRIPTION OF THE INVENTION

Figure 1:
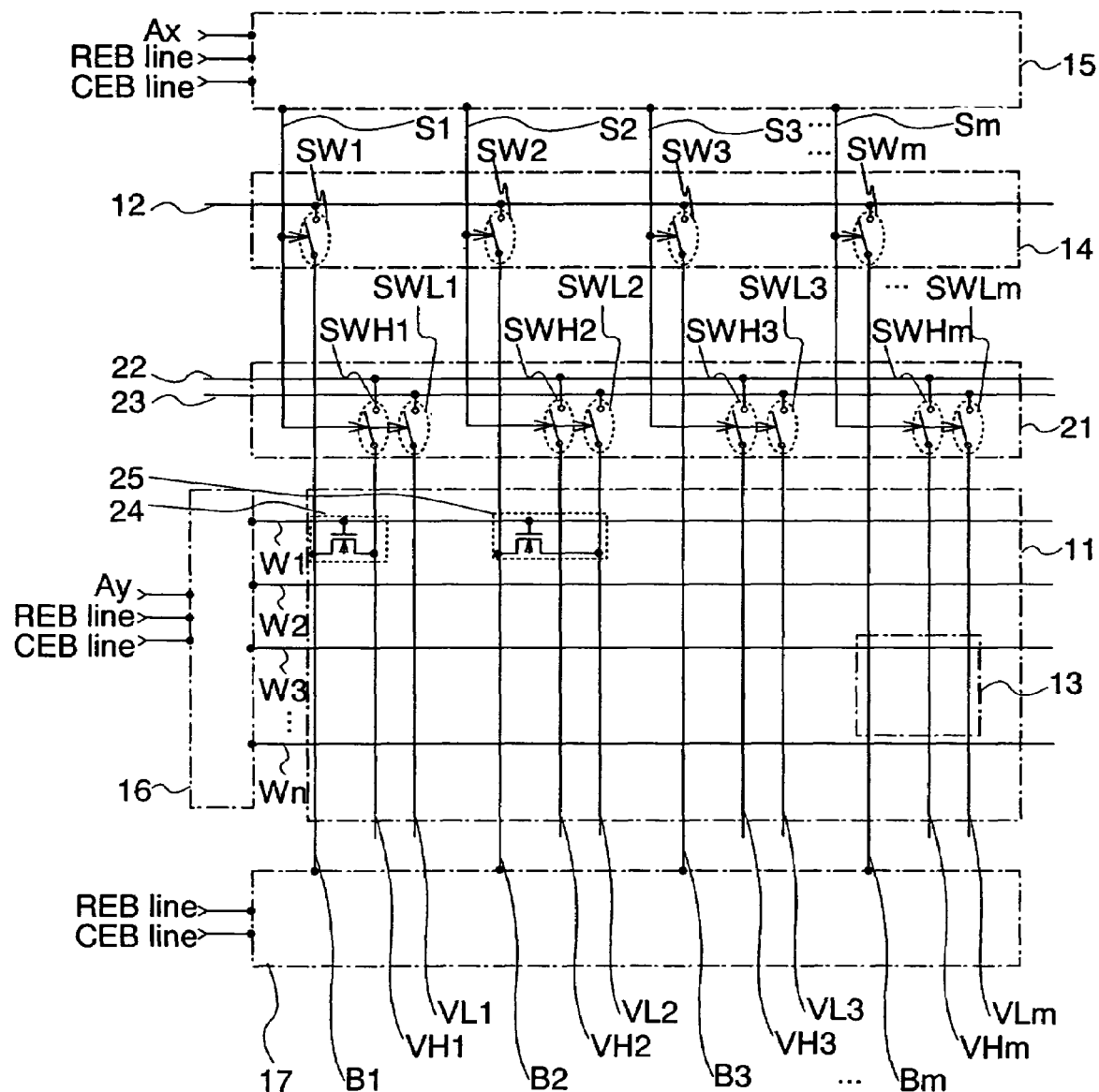
FIG. 1 is a diagram illustrating Embodiment Mode 1 of the invention.

Although the invention will be fully described by way of Embodiment Modes with reference to the accompanying drawings, it is to be understood that various changes and modifications will be apparent to those skilled in the art. Therefore, unless such changes and modifications depart from the scope of the invention hereinafter defined, they should be constructed as being included therein. In configurations of the invention described hereinafter, the identical portions are denoted by the same reference numerals among all the drawings.

Embodiment Mode 1

A semiconductor device having semiconductor elements according to the invention described below using FIG. 1. A semiconductor device including an ID tag comprises a data storage means (a memory cell array) 11 and a power source control means 21.

The data storage means (hereinafter referred to as a memory cell array) 11 has a plurality of memory cells 13 disposed in matrix. In addition, the memory cell array 11 has bit lines B1 to Bm (m is a positive integer) from a first column to an m-th column respectively and word lines W1 to Wn (n is a positive integer) from a first row to an n-th row respectively. In addition, the memory cell array 11 has first power source lines VH1 to VHm (m is a positive integer) and second power source lines VL1 to VLm (m is a positive integer) from the first column to the m-th column respectively. Each of the memory cells 13 includes a memory element in a region where the bit line Bx ($1 \leq x \leq n$) and the word line Wy ($1 \leq y \leq m$) cross each other through an insulator.

The memory element is formed by a transistor. Alternatively, the memory element may be configured by at least one of a capacitor and a resistor. In the case of a masked ROM, for example, a memory element is formed by one transistor like memory elements 24 and 25 in the memory cells 13 in FIG. 1. The invention can be applied to a PROM, an EPROM, an EEPROM, a flash memory, and the like depending on the configuration of a memory element. When data of Hi level (1) is stored in a memory element in a memory cell 13, the memory element is connected to the first power source line VHx ($1 \leq x \leq m$, m is a positive integer) like the memory element 24 whereas when data of Lo level (0) is stored in a memory element in a memory cell 13, the memory element is connected to the second power source line VLx ($1 \leq x \leq m$, m is a positive integer) like the memory element 25.

The power source control means 21 (also referred to as a power source control circuit) for controlling power supply to the memory cell array 11 includes the high voltage power source line (VDD) 22, the low voltage power source line (VSS) 23, pluralities of switches SWHx ($1 \leq x \leq m$, m is a positive integer) and SWLx ($1 \leq x \leq m$, m is a positive integer). Each of the switches SWHx and SWLx is formed by a switching element such as one or a plurality of transistors. The switch SWHx is provided between the first power source line VHx which is connected to a memory element in the memory cell 13, and the high voltage power source line (VDD) 22. On the other hand, the switch SWLx is provided between the second power source line VLx which is connected to a memory element in the memory cell 13, and the low voltage power source line (VSS) 23. Input nodes of the switches SWH1 to SWHm and SWL1 to SWLm are connected to address selection lines Sx ($1 \leq x \leq m$, m is a positive integer) respectively. That is, the switches SWHx and SWLx control connection/non-connection between the first power source line VHx and the high voltage power source line (VDD) 22, and between the second power source line VLx and the low voltage power source line (VSS) 23 through the address selection line Sx.

Figure 2:
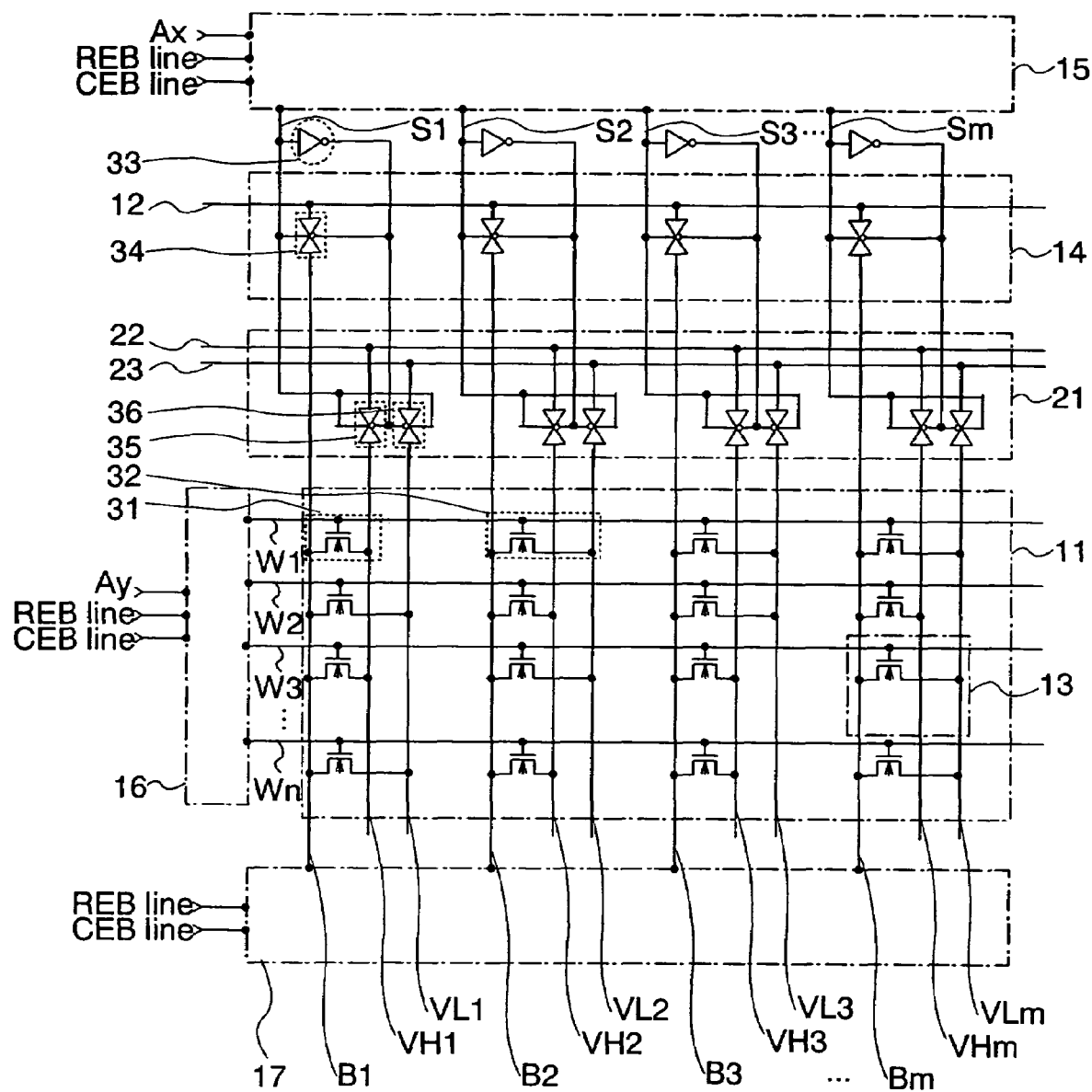
FIG. 2 is a diagram illustrating Embodiment Mode 1 of the invention.

FIG. 2 illustrates a configuration in which the switches SWHx and SWLx in the power source control means 21 are configured by analog switches 35 and 36 respectively. Gate electrodes of an N-channel transistor and a P-channel transistor, which form the analog switch, correspond to an input node of the analog switch. That is, gate electrodes of an N-channel transistor and a P-channel transistor, which form the analog switch, are electrically connected to the corresponding address selection line Sx. Specifically, a gate electrode of the N-channel transistor of the analog switch is directly connected to the corresponding address selection line Sx whereas a gate electrode of the P-channel transistor is connected to an output node of an inverter 33. An input node of the inverter 33 is directly connected to the corresponding address selection line Sx.

Note that, like a transistor 31 in FIG. 2, when a gate electrode of a memory element in a memory cell is connected to the word line W1, one of a source electrode and a drain electrode thereof is connected to the bit line B1, and the other is connected to the high voltage power source line (VDD) 22, the memory cell stores data of Hi level (1). On the other hand, like a transistor 32, when a gate electrode of a memory element in a memory cell is connected to the word line W1, one of a source electrode and a drain electrode thereof is connected to the bit line B2, and the other is connected to the low voltage power source line (VSS) 23, the memory cell stores data of Lo level (0).

A semiconductor device of the invention comprises an address selection means having the selector circuit 14, the first decoder circuit 15 for selecting a switch in the selector circuit 14, and the second decoder circuit 16, in addition to the memory cell array 11 and the power source control means 21.

FIG. 1 shows a configuration in which the selector circuit 14 of a part of the address selection means is formed by a plurality of switches SW1 to SWm. The address selection means is a means for selecting one memory cell from the plurality of memory cells 13 disposed in matrix in the memory cell array 11. The first decoder circuit 15 is connected to the address selection lines S1 to Sm for selecting an address in the column direction. The selector circuit 14 comprises the plurality of switches SW1 to SWm connected to the bit lines B1 to Bm respectively. The second decoder circuit 16 is connected to the word lines W1 to Wm. In addition, the first decoder circuit 15 is connected to address selection lines Sx whereas the second decoder circuit 16 is connected to word lines Wx. Note that the address selection line Sx serves to send a column address selection signal (Ax, $1 \leq x \leq m$) whereas the row address selection word line Wx serves to send a row address selection signal (Ay, $1 \leq y \leq n$). Each of the first decoder circuit 15 and the second decoder circuit 16 is also connected to a plurality of wirings selected by an REB line and a CEB line. The REB line (Read-Enable-Bar) serves to send an REB signal and the CEB line (Chip-Enable-Bar) serves to send a CEB signal, here. The REB signal is a read control signal and the CEB signal is a chip selection signal.

FIG. 2 shows a configuration in which switches in the selector circuit 14 are configured by analog switches 34. Gate electrodes of an N-channel transistor and a P-channel transistor, which form the analog switch, correspond to an input node of the analog switch. That is, gate electrodes of an N-channel transistor and a P-channel transistor, which form the analog switch, are electrically connected to the corresponding address selection line Sx. Specifically, a gate electrode of the N-channel transistor of the analog switch 34 is directly connected to the corresponding address selection line Sx whereas a gate electrode of the P-channel transistor is connected to an output node of the inverter 33. An input node of the inverter 33 is directly connected to the corresponding address selection line Sx.

A semiconductor device of the invention comprises an address selection means having the selector circuit 14, the first decoder circuit 15 for selecting a switch in the selector circuit 14, and the second decoder circuit 16 and a precharge means 17, in addition to the data storage means (memory cell array) 11 and the power source control means 21. The precharge means is a means for setting potential of all bit lines at arbitrary potential while any word line is not selected.

The semiconductor device of the invention may comprises a display means having a plurality of pixels (not shown) in addition to the data storage means 11 and the power source control means 21. By providing the display means, a multifunctional semiconductor device with high added value can be provided In addition, the semiconductor device of the invention may comprise a sense amplifier for determining binary data, an output circuit for outputting data (an output buffer circuit), and the like as required, though not shown in the drawing.

Figure 3:
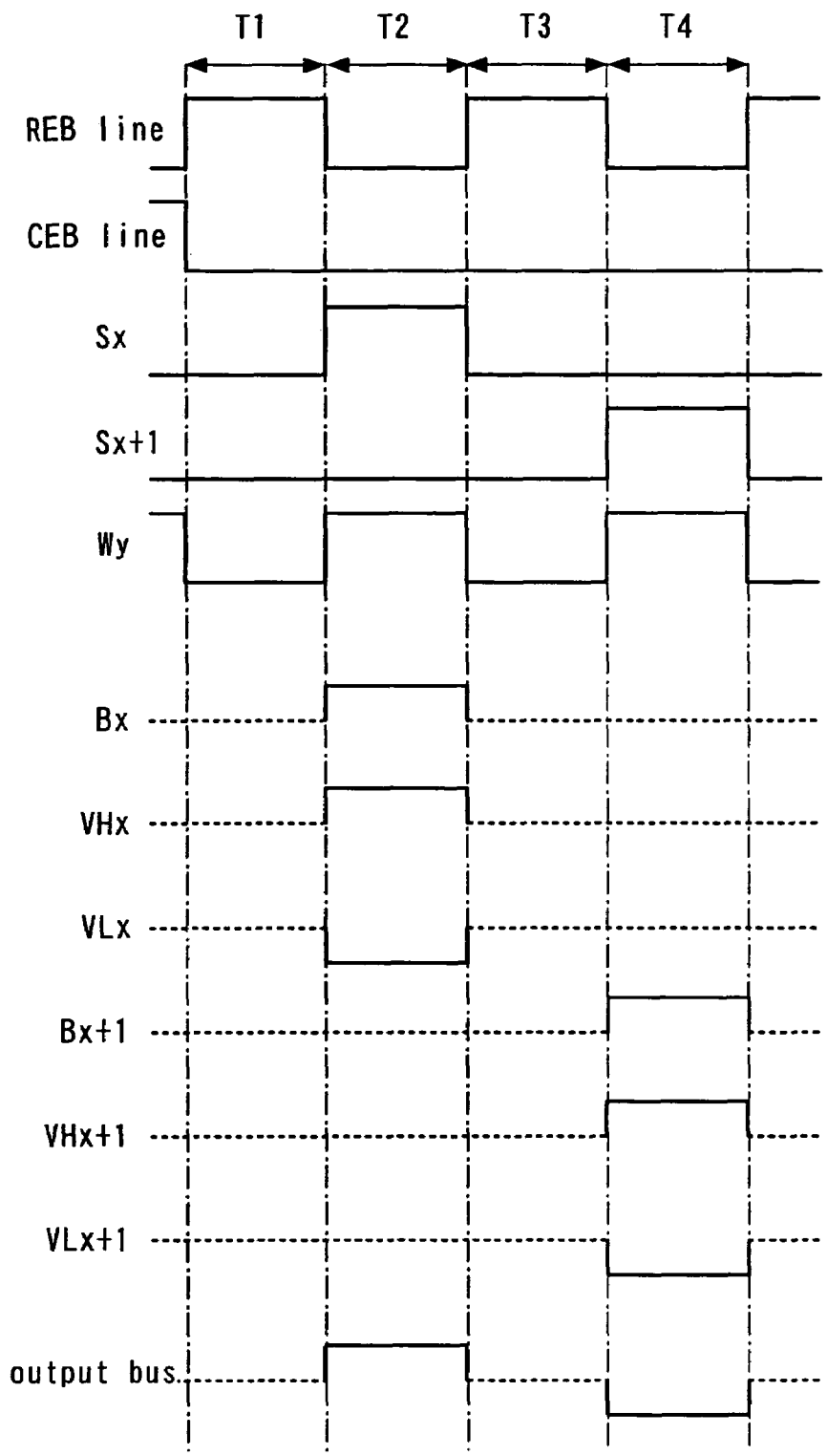
FIG. 3 is a diagram illustrating Embodiment Mode 1 of the invention.
Figure 4:
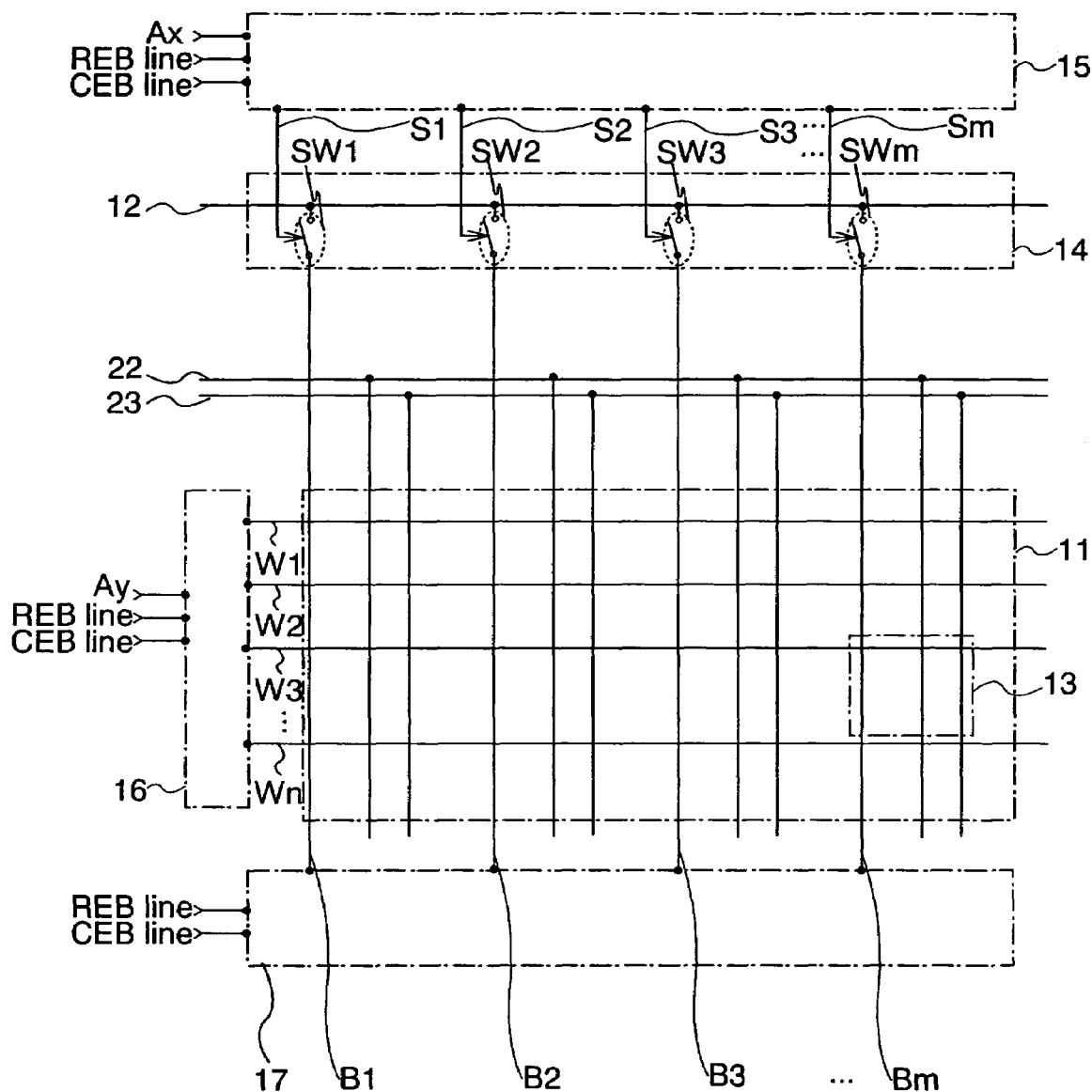
FIG. 4 is a diagram illustrating a configuration of a conventional semiconductor device.
Figure 5:
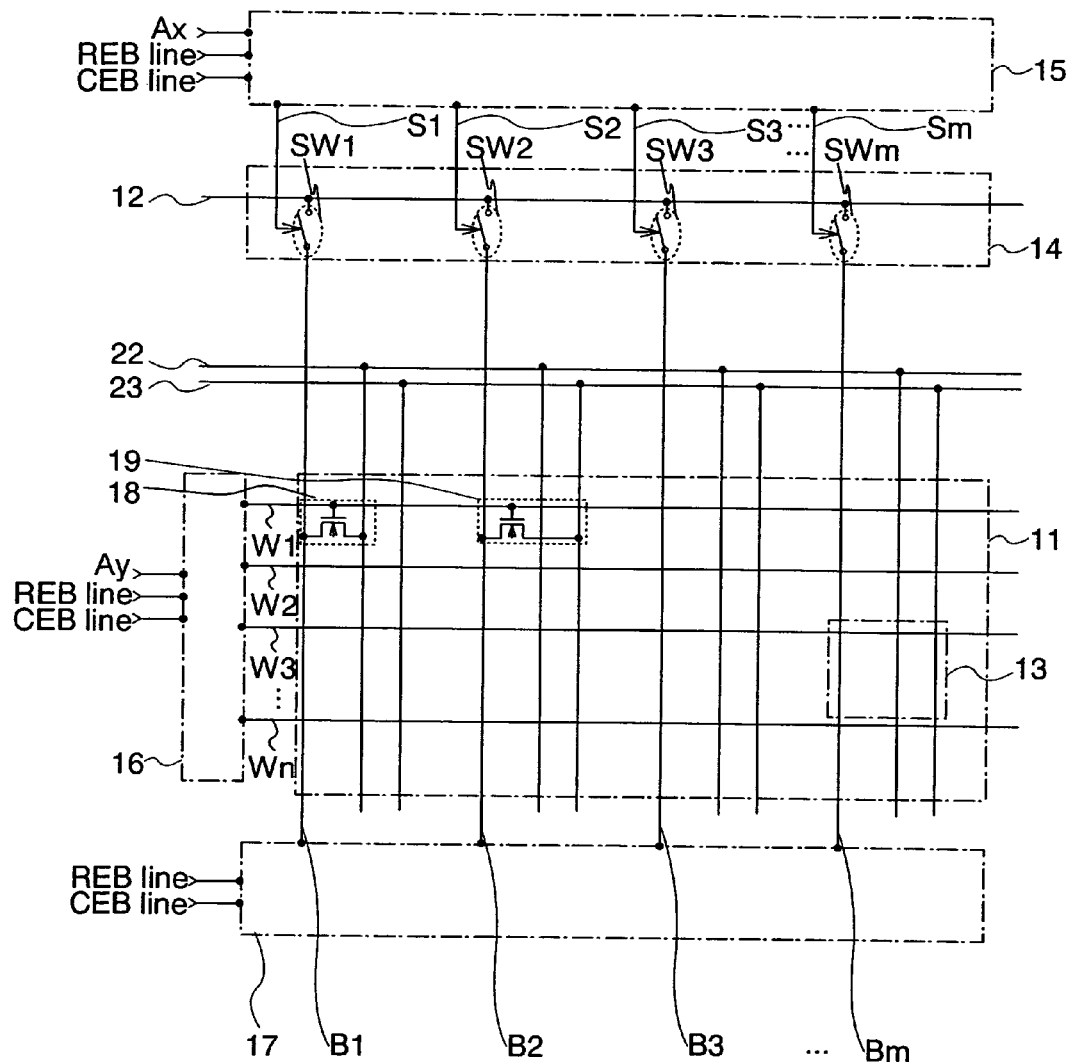
FIG. 5 is a diagram illustrating a configuration of a conventional semiconductor device.

An operation of a semiconductor device having the above-described configuration is described below using a timing chart shown in FIG. 3.

Described herein is the case where data reading is not performed when the RED is at Hi level (1) and the CEB is at Lo level (0) whereas data reading is performed when the RED and the CEB are each at Lo level (0). The timing chart of FIG. 3 shows respective waveforms of potential of wirings at a certain time. In addition, a dotted line of the waveform denotes a flowing state (unstable state and the like). In addition, a memory cell selected by a bit line Bx and a word line Wy stores data of Hi level (1), and a memory cell selected by a bit line Bx+1 and the word line Wy stores data of Lo level (0).

In a period Ti, the CEB is at Lo level (0), the RED is at Hi level (1), an address selection line for selecting an address of the x-th column Sx is at Lo level (0), an address selection line for selecting an address of the (x+1)-th column Sx+1 is at Lo level (0), and a word line of the y-th row Wy is at Lo level (0). Data reading is not performed when the CEB is at Lo level (0) and the RED is at Hi level (1). The address selection lines Sx and Sx+1 are each at Lo level (0), therefore, respective switches SWx and SWx+1 in the selector circuit, and respective switches SWHx and SWLx, SWHx+1 and SWLx+1 in the power source control circuit corresponding to the address selection lines Sx and Sx+1 are not selected to be in the non-conductive state. Accordingly, the output bus and the bit lines Bx and Bx+1, the first power source lines VHx and VHx+1 and the high voltage power source line (VDD), the second power source lines VLx and VLx+1 and the low voltage power source line (VSS) are not connected respectively. The word line Wy is low, so that each transistor as a memory element in a plurality of memory cells connected to the word line Wy is not selected, and thus the state between a source electrode and a drain electrode thereof becomes conductive. Consequently, wirings other than the CEB, the RED, the Sx, the Sx+1, and the Wy, namely the Bx, the Bx+1, the VHx, the VHx+1, the VLx, and the VLx+1 are in the floating state.

In a period T2, the CEB is at Lo level (0), the RED is at Lo level (0), the address selection line for selecting an address of the x-th column Sx is at Hi level (1), the address selection line for selecting an address of the (x+1)-th column Sx+1 is at Lo level (0), and the word line of the y-th row Wy is at Hi level (1). Data reading is performed when the CEB and the RED are each at Lo level (0). Since the address selection line Sx is at Hi level (1), the switch SWx in the selector circuit 14 and the switches SWHx and SWLx in the power source control circuit corresponding to the address selection line Sx 21 are selected to be in the conductive state. Accordingly, the bit line Bx is selected, and the output bus 12 and the bit line Bx, the first power source line VHx and the high voltage power source line (VDD) 22, the second power source line VLx and the low voltage power source line (VSS) 23 are connected respectively. The word line Wy is Hi, so that a transistor in a memory cell in a region where the bit line Bx and the word line Wy cross each other is selected. The memory cell in the region where the bit line Bx and the word line Wy cross each other stores data of Hi level (1), therefore, the bit line Bx and the first power source line VHx each connected to a source electrode and a drain electrode of the transistor are in the conductive state. Although the first power source line VHx is connected to the high voltage power source line (VDD) 22, and the bit line Bx is connected to the output bus 12 as mentioned above, data of Hi level (1) is read out to the output bus 12. Whereas, the address selection line Sx+1 is at Lo level (0), therefore, the switches SWx+1 in the selector circuit 14 and the switches SWHx+1 and SWLx+1 in the power source control circuit 21 corresponding to the address selection line Sx+1 are not selected to be in the non-conductive state. The output bus 12 and the bit line Bx+1, the first power source line VHx+1 and the high voltage power source line (VDD), the second power source line VLx+1 and the low voltage power source line (VSS) are not connected respectively. The word line Wy is Hi, so that a transistor in a memory cell in a region where the bit line Bx+1 and the word line Wy cross each other is selected. The memory cell in the region where the bit line Bx+1 and the word line Wy cross each other stores data of Lo level (0), therefore, the bit line Bx+1 and the second power source line VLx+1 each connected to a source electrode and a drain electrode of the transistor are in the conductive state. However, since the second power source line VLx+1 is not connected to the low voltage power source line (VSS), and the bit line Bx+1 is not connected to the output bus 12 as mentioned above, data of Lo level (0) is not read out to the output bus 12 and power is not supplied, resulting in preventing unnecessary current flowing. Consequently, in the period T2, the Bx is at Hi level (1, VDD), the VHx is at Hi level (1, VDD), the VLx is at Lo level (0, VSS), the Bx+1, the VHx+1, and the VLx+1 are in the floating state, and the output bus 12 is at Hi level (1, VDD).

In a period T3, the same signals as in the period Ti is input, that is, the CEB is at Lo level (0), the RED is at Hi level (1), the Sx is at Lo level (0), the Sx+1 is at Lo level (0), and the Wy is at Lo level (0), therefore, the Bx, the Bx+1, the VHx, the VHx+1, the VLx, and the VLx+1 are in the floating state.

In a period T4, the CEB is at Lo level (0), the RED is at Lo level (0), the address selection line Sx for selecting an address of the x-th column is at Lo level (0), the address selection line Sx+1 for selecting an address of the (x+1)-th column is at Hi level (1), and the word line Wy of the y-th row is at Hi level (1). Data reading is performed when the CEB and the RED are each at Lo level (0). The address selection line Sx+1 is at Hi level (1), therefore, the switch SWx+1 in the selector circuit 14 and the switches SWHx+1 and SWLx+1 in the power source control circuit 21 corresponding to the address selection line Sx+1 are selected to be in the conductive state. Accordingly, the bit line Bx+1 is selected, and the output bus 12 and the bit line Bx+1, the first power source line VHx+1 and the high voltage power source line (VDD) 22, the second power source line VLx+1 and the low voltage power source line (VSS) 23 are connected respectively. The word line Wy is at Hi, so that a transistor in a memory cell in a region where the bit line Bx+1 and the word line Wy cross each other is selected. The memory cell in the region where the bit line Bx+1 and the word line Wy cross each other stores data of Lo level (0), the bit line Bx+1 and the second power source line VLx+1 each connected to a source electrode and a drain electrode of the transistor are in the conductive state. Although the second power source line VLx+1 is connected to the low voltage power source line (VSS) 23, and the bit line Bx+1 is connected to the output bus 12 as mentioned above, data of Lo level (0) is read out to the output bus 12. Whereas, the address selection line Sx is at Lo level (0), therefore, the switch SWx in the selector circuit 14 and the switches SWHx and SWLX in the power source control circuit 21 corresponding to the address selection line Sx are not selected to be in the non-conductive state. The output bus 12 and the bit line Bx, the first power source line VHx and the high voltage power source line (VDD) 22, the second power source line VLx and the low voltage power source line (VSS) 23 are not connected respectively. The word line Wy is Hi, so that a transistor in a memory cell in a region where the bit line Bx and the word line Wy cross each other is selected. The memory cell in the region where the bit line Bx and the word line Wy cross each other stores data of Hi level (1), therefore, the bit line Bx and the first power source line VHx each connected to a source electrode and a drain electrode of the transistor are in the conductive state. However, since the first power source line VHx is not connected to the high voltage power source line (VDD) 22, and the bit line Bx is not connected to the output bus 12 as mentioned above, data of Hi level (1) is not read out to the output bus 12 and power is not supplied, resulting in preventing unnecessary current flowing. Consequently, in the period T4, the Bx+1 is at Hi level (1, VDD), the VHx+1 is at Hi level (1, VDD), the VLx+1 is at Lo level (0, VSS), the Bx, the VHx, and the VLx are in the floating state, and the output bus 12 is at Lo level (0, VSS).

Respective operations described above are performed in each period of Ti to T4 to control data reading.

According to the invention having the above-described configuration, in some memory cell of which word line Wx is selected whereas of which bit line Bx is not selected, it is possible that a first power source line VHx and the high voltage power source line (VDD) 22, and a second power source line VLx and the low voltage power source line (VSS) 23 are not connected to each other. Accordingly, no power is supplied to a drain electrode or a source electrode which is connected to one of the first power source line VHx and the second power source line VLx. The first power source line VHx and the second power source line VLx each show data in the memory cell. Consequently, the state between both terminals of the transistor of the memory cell, namely between the bit line Bx and the source electrode or the drain electrode becomes conductive, however, power is not supplied, which can prevent unnecessary current flowing. A semiconductor device or an ID tag having the above-described configuration allows to reduce current consumption when some word line is selected and read data with accuracy in this manner.

Embodiment Mode 2

Figure 7:
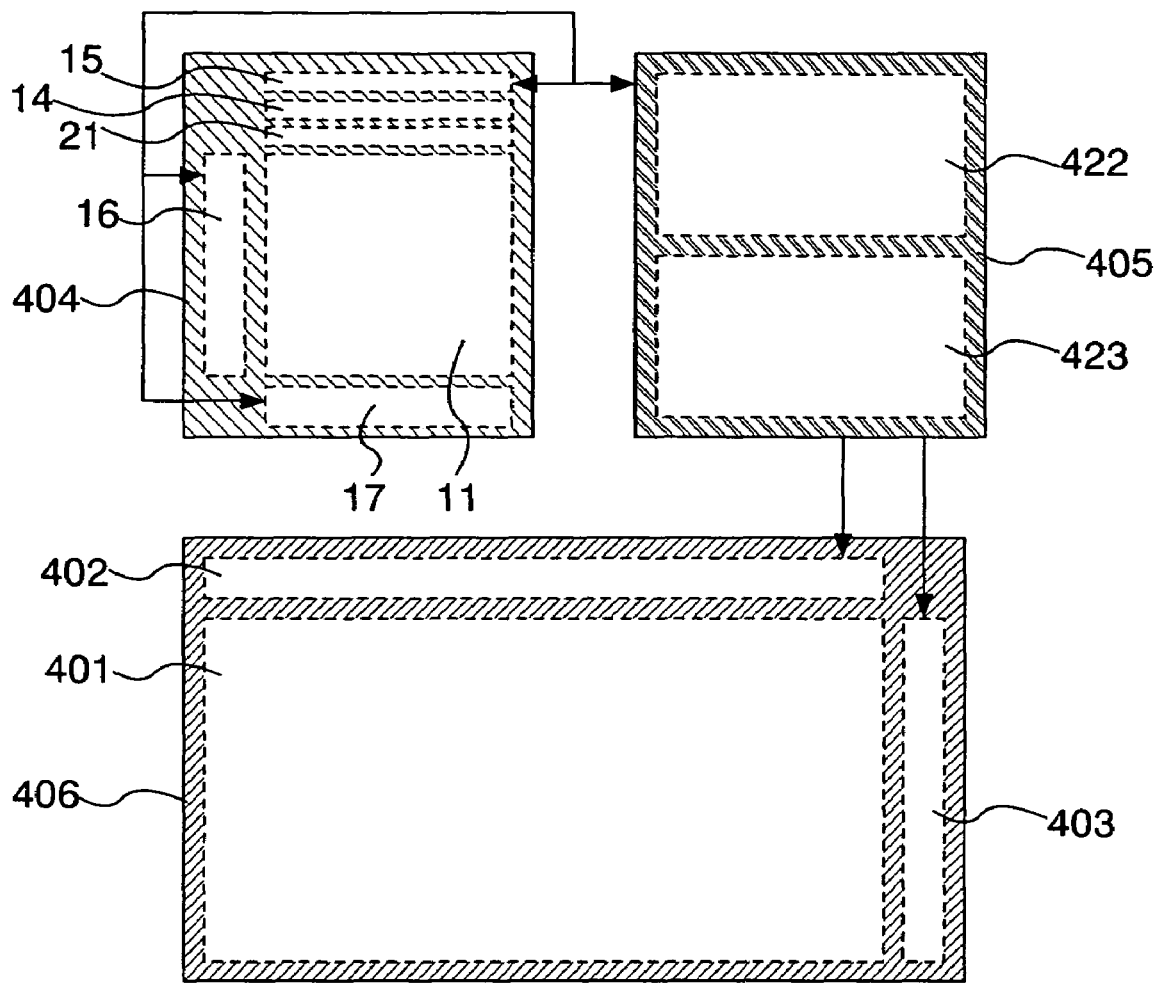
FIG. 7 is a diagram illustrating Embodiment Mode 2 of the invention.

A panel which is an embodiment mode of a semiconductor device of the invention is described with reference to FIGS. 6A, 6B and 7. A panel comprises a substrate 406 over which a pixel portion 401 having a plurality of pixels, driver circuits 402 and 403 each including a plurality of transistors are formed (see FIG. 6A). Although the driver circuits 402 and 403 are integrally formed over the substrate 406, they may be attached or mounted on the substrate 406 by COG method as well. Thus, a display means corresponds to the pixel portion 401 only, or the pixel portion 401 and the driver circuits 402 and 403. The panel further comprises a memory means 404 such as a VRAM (Video Random Access memory), a RAM, or a ROM, and a CPU 405 over the substrate 406. In addition, the panel comprises an input terminal 409 for supplying a control signal of the driver circuits 402 and 403, the memory means 404, and the CPU 405 over the substrate 406. The input terminal 409 is supplied with signals such as a video signal and potential through a connecting film 408. In addition, the panel comprises a sealing material (not shown) around the pixel portion 401 and the driver circuits 402 and 403, and the substrate 406 and an opposing substrate 407 are attached by the sealing material. Note that although the opposing substrate 407 is disposed above the pixel portion 401 and the driver circuits 402 and 403 only, it may be disposed above the whole surface of the substrate 406. In such a case, a heat sink is preferably provided so as to overlap with the CPU 405 because the CPU 405 may generate heat.

FIG. 6B is a cross-sectional diagram of the panel shown in FIG. 6A along a line A-A'. The pixel portion 401 includes a TFT 411 and a capacitor 412, the driver circuit 402 includes a group of TFTs 419, and the memory means 404 includes a group of TFTs 420. An alignment film 414, a liquid crystal layer 415, an alignment film 416, an opposing electrode 417, and a sealing material 418 are interposed between the substrate 406 and the opposing substrate 407. Polarizers (not shown) are attached to the substrate 406 and the opposing substrate 407 respectively.

An element of the circuit over the substrate 406 is preferably formed using a polycrystalline semiconductor film (polysilicon film) as an active layer having more favorable properties such as mobility compared to an amorphous semiconductor, thereby realizing the circuits being formed monolithically on the same substrate. A panel in which a function circuit such as a memory means and a CPU is integrally formed over the same substrate as a pixel portion and a driver circuit is referred to as a system-on-panel, which can provide a multifunctional system. The panel having the above-described structure can achieve downsizing, lightweight, and thin shape since the number of external ICs to be connected is reduced. It is extremely effective that the panel is applied to a portable terminal that has been in widespread use in recent years. Note that although this embodiment mode illustrates the panel employing a liquid crystal element as a display element, the invention is not limited to this. The invention can be applied to any panel employing another display element such as a light emitting element.

The configuration of a semiconductor device described in Embodiment Mode 1 is applied to the memory means 404 of the panel. That is, the memory means 404 comprises the memory cell array 11 and the power source control means 21. In addition, the memory means 404 comprises an address selection means having the selector circuit 14, the first decoder circuit 15 for selecting the switch in the selector circuit 14, and the second decoder circuit 16, and the precharge means 17 (see FIG. 7). Accordingly, the panel of the invention can realize a multifunctional semiconductor device with high added value in which a current consumption upon selecting a word line is suppressed and accurate data reading is carried out.

Relations among a display means having the pixel portion 401 and the driver circuits 402 and 403 formed over a substrate 406, the memory means 404, and the CPU 405 and an operation thereof are described briefly below. In the case of reading or writing data from/to the memory means 404, address data in a memory cell in which data is stored or to be stored is supplied from a program counter in the control portion 422 of the CPU 405 to the address selection means of the memory means 404. The data read from the specified address is supplied to a control register 423 in the CPU 405 whereas the data to be written to the specified address is supplied from the control register 423. The pixel portion 401 of the display means displays an image in accordance with signals of the driver circuits 402 and 403 supplied from the CPU 405. Note that a video signal stored in the memory means 404 is supplied to the driver circuit 402 on a signal line side through the CPU 405. This embodiment mode can be implemented in combination with Embodiment Modes described above.

Embodiment Mode 3

The configuration of an ID tag (also referred to as an RFID tag, an IC tag, and an electronic tag) of the invention is described using FIGS. 8A to 8E below. An ID tag of the invention 306 has a semiconductor integrated circuit (IC chip) comprising a memory means 301, a control means 302, and a power source generation means 303, and an antenna 305 (see FIG. 8A). The semiconductor integrated circuit can be formed by a semiconductor element using a single-crystalline semiconductor substrate (e.g., a MOSFET, a bipolar transistor, and an inductor) or a semiconductor element using a semiconductor thin film (e.g., a TFT, an organic transistor, a diode, and an MIM element).

The configuration of a semiconductor device described in Embodiment Mode 1 is applied to the memory means 301. That is, the memory means 301 comprises the memory cell array and the power source control means. Accordingly, the ID tag 306 of the invention enables reduction in current consumption upon selecting a word line and accurate data reading. Note that the memory means 301 may be any one of a masked ROM, a PROM, an EPROM, an EEPROM, a flash memory and the like depending on a configuration of a memory element of the storage means 11, however, a masked ROM is preferably employed as the memory means 301 for an ID tag.

The control means 302 is formed by a logic circuit. In the case of a non-contact type ID tag, the power source generation means 303 adopts an electromagnetic induction, a mutual induction, or an electrostatic induction of the coiled antenna 305. In such a case, the power source generation means 303 also serves as the antenna 305. The level of frequency to receive can be changed by controlling the number of coil windings of the antenna 305.

Figure 8A:
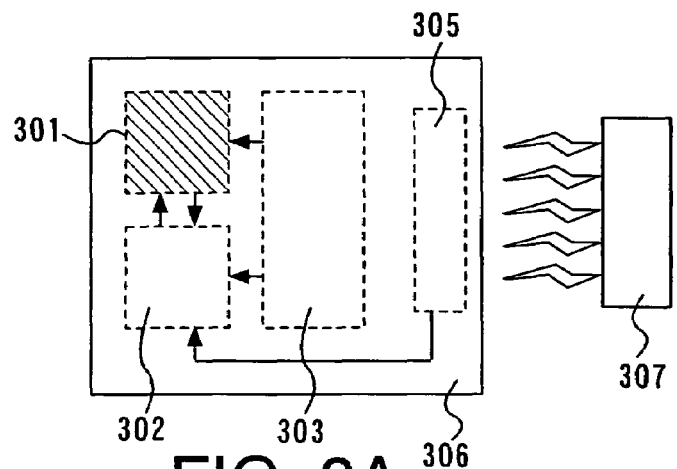
FIGS. 8A to 8E are diagrams illustrating Embodiment Mode 3 of the invention.
Figure 8B:
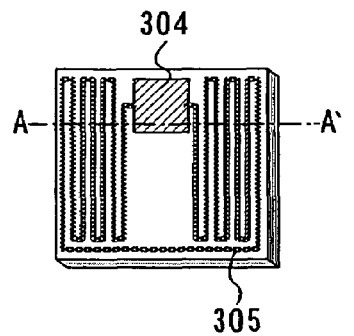
Figure 8C:
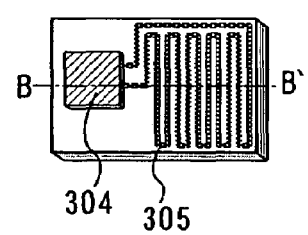
Figure 8D:
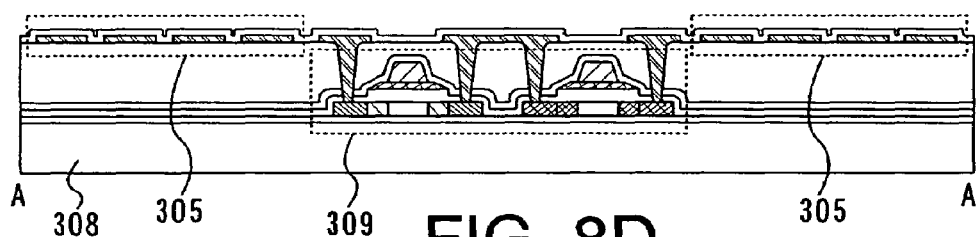
Figure 8E:
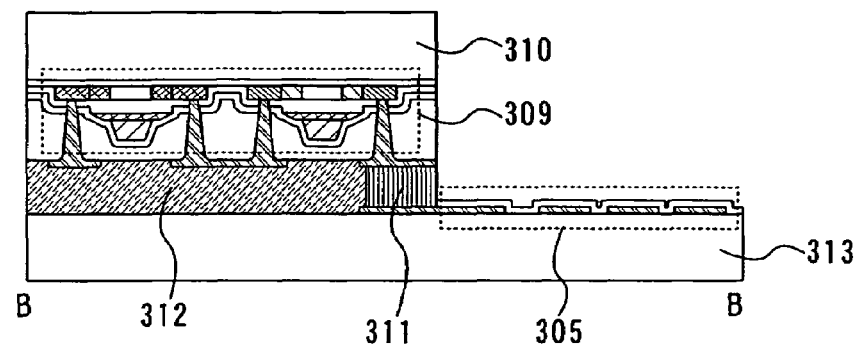

The antenna 305 may be formed over the same substrate as the semiconductor integrated circuit 304 (see FIGS. 8B and 8D), or alternately, the semiconductor integrated circuit 304 may be mounted on the substrate 313 comprising the antenna 305 (see FIGS. 8C and 8E). In the former method, a group of TFTs 309 and the antenna 305 are formed over a substrate 308 (see FIG. 8D). In the latter method, the group of TFTs 309 formed over a substrate 310 is mounted on the substrate 313 comprising the antenna 305 with a conductive layer 311 and an insulating layer 312 interposed therebetween (see FIG. 8E). Note that the group of TFTs 309 each shown in FIGS. 8D and 8E is a component for any one of the memory means 301, the control means 302, and the power source generation means 303.

A semiconductor device comprising a coiled antenna is described using FIGS. 11A to 11D.

FIGS. 11A and 11C are a top plan diagram and a cross-sectional diagram along a line A-A' of FIG. 11A respectively, showing a semiconductor device in which the semiconductor integrated circuit 304 and an antenna 335 are formed over the same substrate. The antenna 335 is formed simultaneously with source electrodes and drain electrodes of the group of TFTs 309, and one end of the antenna 335 is connected to the group of TFTs 309. An insulating film 336 and a wiring 337 are formed over the antenna 335 in this order. The other end of the antenna 335 and the group of TFTs 309 are connected to each other by the wiring 337.

FIGS. 11B and 11D are a top plan diagram and a cross-sectional diagram along a line B-B' of FIG. 11B respectively, showing a semiconductor device in which the antenna 335 is formed over the substrate 313 and the semiconductor integrated circuit 304 is mounted on the substrate 313. The group of TFTs 309 and an end of the antenna 335 are electrically connected to each other through the conductive layer 311 and a wiring 338.

Figure 15A:
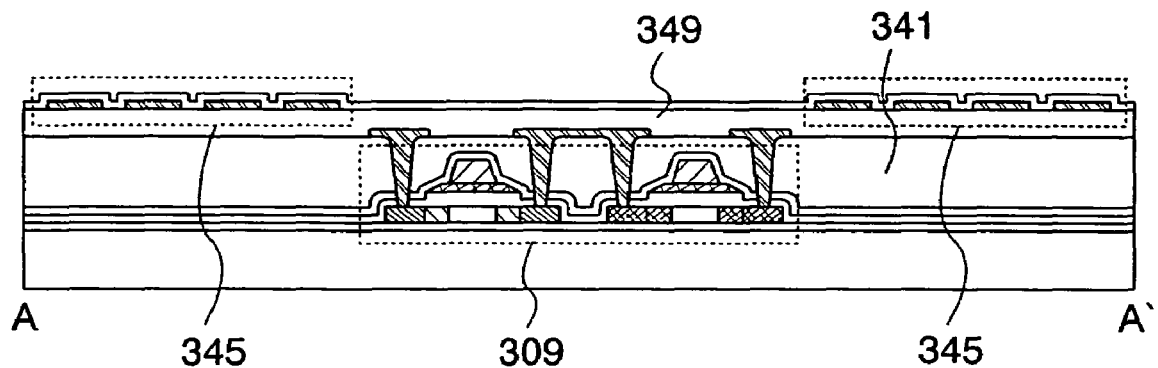
FIGS. 15A and 15B are diagrams illustrating Embodiment Mode 3 of the invention.

Alternately, as shown in FIG. 15A, it is possible to form a second interlayer insulating film 349 over a first interlayer insulating film 341 using which the group of TFTs 309 are formed, and an antenna 345 over the second interlayer insulating film 349. This allows an antenna to be formed over the group of TFTs 309, and therefore, the antenna can be formed at arbitrarily intervals.

Figure 15B:
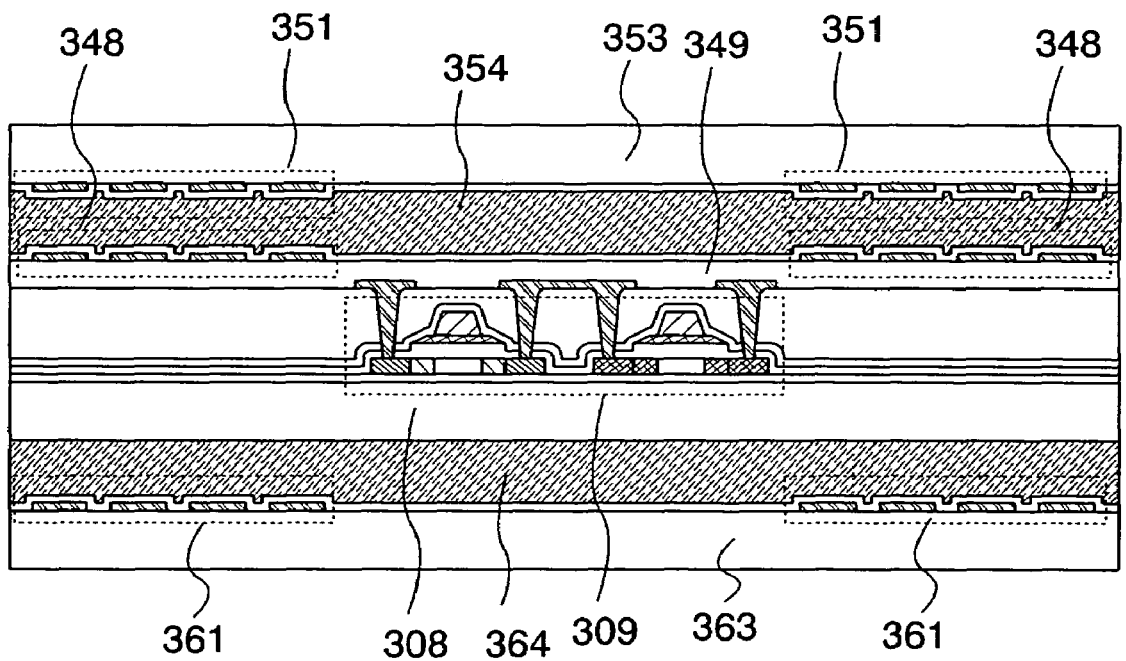

Furthermore, as shown in FIG. 15B, it is possible to interpose the semiconductor integrated circuit comprising an antenna 348 shown in FIG. 15A between substrates over which antennas 351 and 361 are formed. The substrate 308 over which the group of TFTs 309 are formed and an substrate (a second substrate) 363 over which an antenna 361 is formed are adhered to each other with a first adhesive material 364. Whereas, an antenna 348 formed over the group of TFTs 309 with the second interlayer insulating film 349 interposed therebetween and a substrate (a third substrate) 353 over which an antenna 351 is formed are adhered to each other with a second adhesive material 364.

In FIG. 15B, although the substrate 308 having the group of TFTs 309 and the antenna 348 is interposed between the different two substrates such as the second substrate 363 and the third substrate 353, the invention is not limited to this structure. For example, it is possible to interpose the substrate 308 having the group of TFTs 309 and the antenna 348 between the second substrate 363 being folded. It is also possible to interpose the substrate 308 having the group of TFTs 309 without the antenna 348 by one or a plurality of substrates.

In such cases, an antenna can be formed longer than the one of the semiconductor device shown in FIG. 15A.

Described briefly below is a communication procedure with the ID tag 306 (see FIG. 8A). First, the antenna 305 in the ID tag 306 receives radio waves from a reader/writer 307 and the electromotive force is generated due to resonance in the power source generation means 303. Accordingly, the IC chip in the ID tag 306 operates so that data in the memory means 301 is signalized by the control means 302. Subsequently, the antenna 305 in the ID tag 306 sends the signal to an antenna in the reader/writer 307. The received signal is sent to a data processing device (not shown) through a controller (not shown) in the reader/writer 307 to perform the data processing using software. Note that in the communication procedure described above, a coiled antenna 305 is employed and an electromagnetic system utilizing a magnetic flux due to induction between the coil of an ID tag 306 and the coil of a reader/writer 307 is adopted, though a radio wave system using a microwave radio wave may be adopted.

The ID tag 306 is advantageous in that a non-contact communication is performed, a plurality of data can be read at a time, data can be written thereto, transformation into a various types of shape is possible, wider directivity and wider recognizable range can be ensured by selecting the frequency, and the like. The ID tag 306 can be applied to an IC tag which can recognize respective data of a person or an object by a wireless communication in a non-contact manner, a label attachable to an object, a wristlet for use at an event or for an amusement, and the like. In addition, the ID tag 306 may be shaped by using a resin material, or may be directly fixed to a metal for blocking a wireless communication. The ID tag 306 can be also applied to a system operation such as a close-leaving managerial system and a checkout system.

Figure 9A:
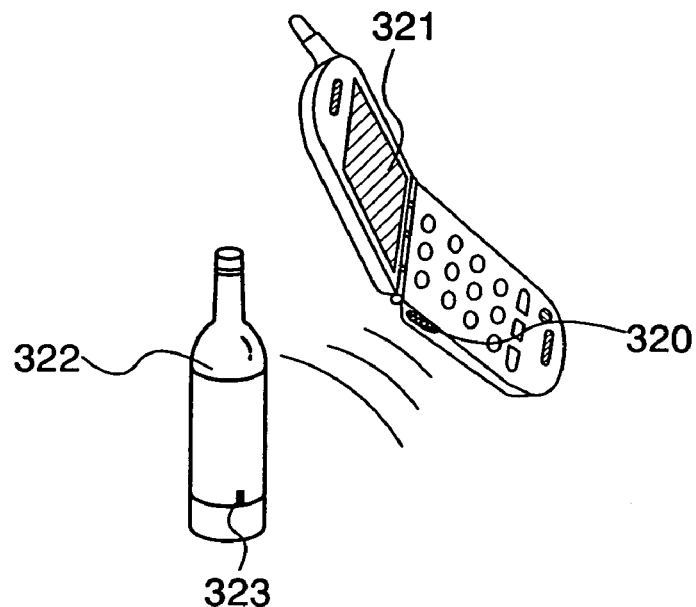
FIGS. 9A and 9B are views illustrating Embodiment Mode 3 of the invention.
Figure 9B:
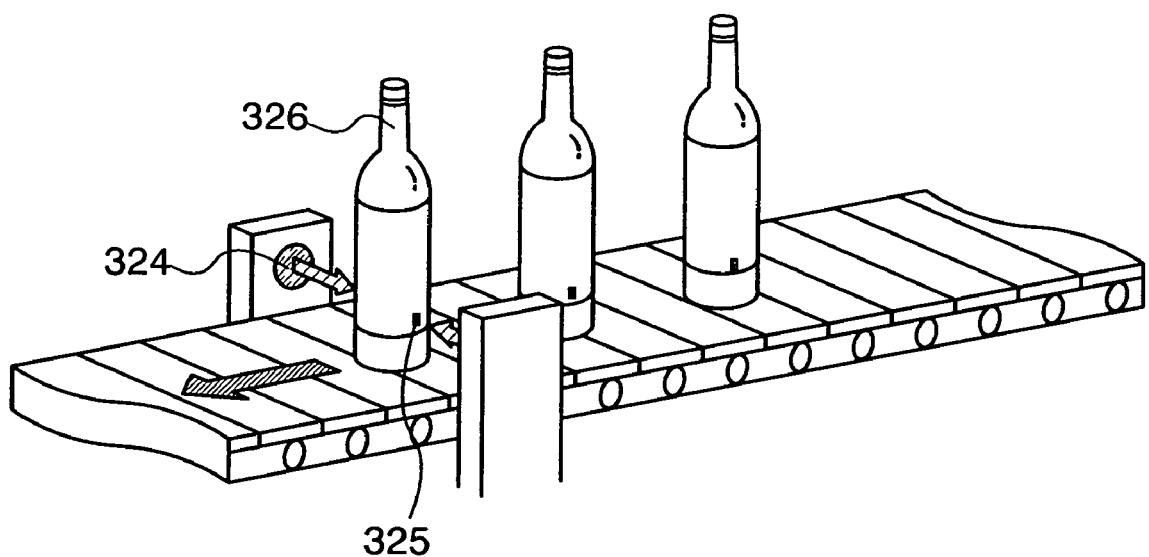

Examples of practical use of the ID tag 306 are described using FIGS. 9A and 9B. As shown in FIG. 9A, a reader/writer 320 is provided on one side of a portable terminal having a display portion 321 whereas an ID tag 323 is provided on a side surface of merchandise 322. When the reader/writer 320 is put close to the ID tag 323 of the merchandise 322, data of the merchandise 322 such as primary material, region of origin, inspection result per production step, record of distribution process, or explanation of the merchandise is displayed.

Furthermore, as shown in FIG. 9B, merchandise 326 can be checked using a reader/writer 324 and an ID tag 325 which is provided on the merchandise 326 while conveying the merchandise 326 by a belt conveyor. By utilizing the ID tag for a system like the above, data can be easily obtained and a multifunctional device with high added value can be realized.

Embodiment Mode 4

This embodiment mode describes a manufacturing method of a semiconductor device, in particular, a transfer step of a semiconductor integrated circuit on a flexible substrate using FIGS. 12A to 13C below.

Described in this embodiment mode is a manufacturing method in which an integrated circuit is formed by using a crystallized semiconductor film over a glass substrate, and the semiconductor integrated circuit is transferred to a flexible substrate. Note that although a TFT is employed as a semiconductor element herein, a memory element, a diode, a photoelectric converter, a resistor, a coil, a capacitor, an inductor, and the like may be employed to implement the invention as well.

Figure 12A:
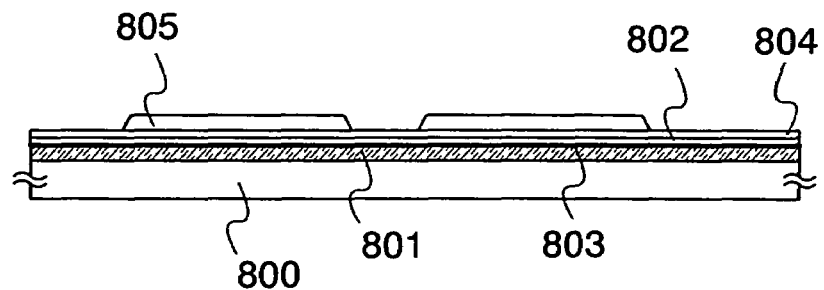
FIGS. 12A to 12C are diagrams illustrating Embodiment Mode 4 of the invention.

First, as illustrated in FIG. 12A, a metal film 801 and an oxide film 802 are laminated over a first substrate 800 by sputtering. A top surface of the metal film 801 is oxidized due to pre-sputtering which is performed prior to sputtering when forming the oxide film 802, which forms an ultra-thin metal oxide film 803 between the metal film 801 and the oxide film 802. After a base film 804 and a semiconductor film are formed, the semiconductor film is crystallized by using laser light and patterned to form an island-like semiconductor film 805. Subsequently, a gate insulating film 807 is formed so as to cover the island-like semiconductor film 805. A conductive film is formed over the gate insulating film 807 and patterned to form a gate electrode 808. Then, n-type impurities are added to the island-like semiconductor film 805 to form a source region, a drain region, and the like. Note that a TFT 806 is an n-type TFT herein. In the case of a p-type TFT, a p-type impurity is added.

Figure 12B:
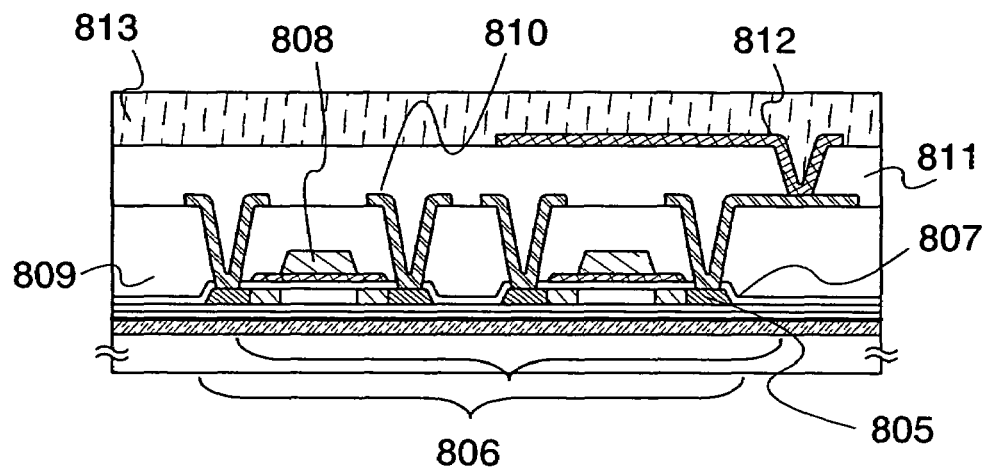

Second, as illustrated in FIG. 12B, a first interlayer insulating film 809 is formed so as to cover the TFT 806. After contact holes are formed in the gate insulating film 807 and the first interlayer insulating film 809, a wiring 810 is formed on the first interlayer insulating film 809 so as to be connected to the TFT 806 through the contact holes. The TFT 806 is completed by a series of the steps described above, though a manufacturing method of a TFT is not limited to the above-described one.

A second interlayer insulating film 811 is formed over the first interlayer insulating film 809 so as to cover the wiring 810. In the case where an antenna which is formed outside of the substrate is connected, for example, contact holes are further formed in the second interlayer insulating film 811 and a pad 812 is formed on the second interlayer insulating film 811 so as to be connected to the wiring 810 through the contact holes.

Figure 12C:
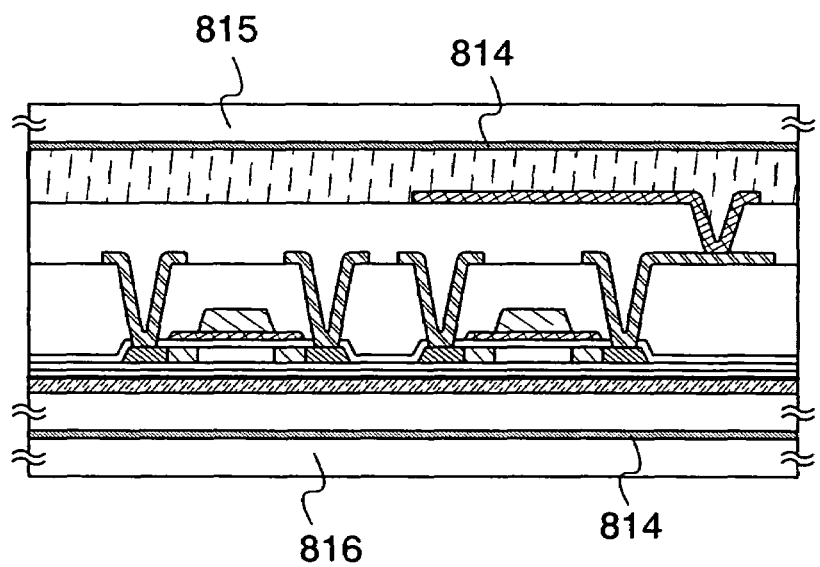

A passivation layer 813 is formed over the second interlayer insulating film 811 and the pad 812. In order to perform the subsequent peeling step, the metal oxide film 803 is crystallized. Then, a second substrate 815 is attached to the passivation layer 813 while a third substrate 816 is attached to the first substrate 800 with a double-stick tape 814 respectively (FIG. 12C). The third substrate 816 prevents the first substrate 800 from being damaged in the subsequent peeling step.

Figure 13A:
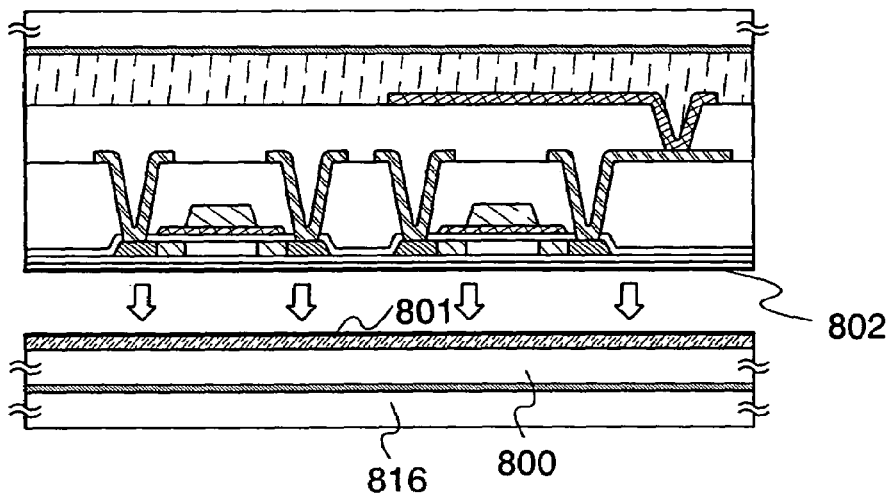
FIGS. 13A to 13C are diagrams illustrating Embodiment Mode 4 of the invention.
Figure 13B:
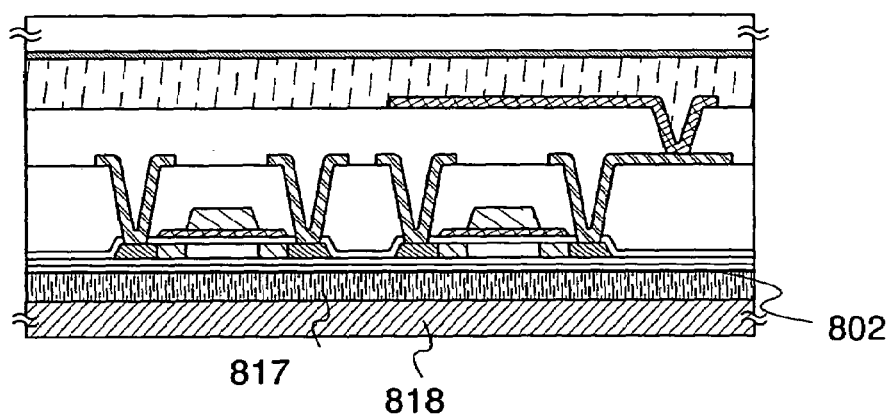

Subsequently, the metal film 801 and the oxide film 802 are separated from each other by a physical means as illustrated in FIG. 13A. The oxide film 802 is then adhered to a flexible substrate 818 with an adhesive material 817 (FIG. 13B).

Figure 13C:
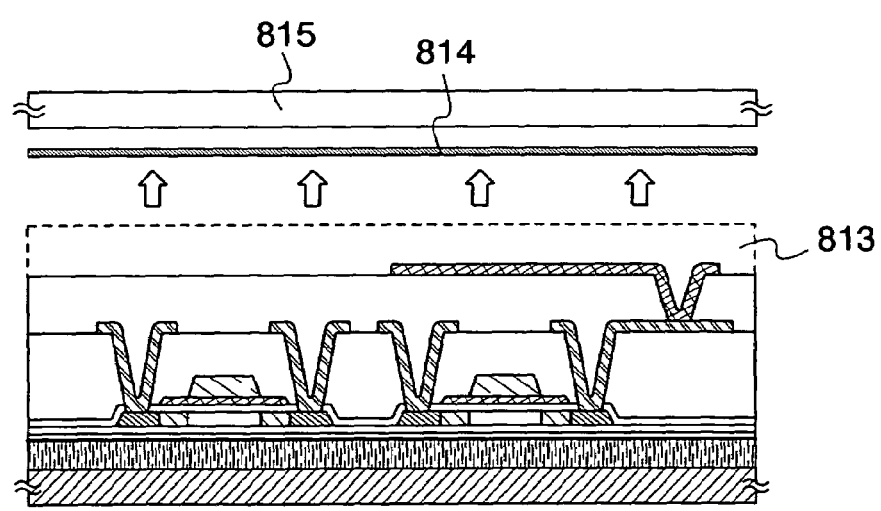

Then, as illustrated in FIG. 13C, the double-stick tape 814 and the second substrate 815 are separated from the passivation layer 813, and the passivation layer 813 is removed. Accordingly, the integrated circuit can be transferred to a flexible substrate.

In this embodiment mode, description is made on the case of transferring an integrated circuit by two peeling steps, though the invention is not limited to this. For example, it is possible to substitute an object to mount an ID chip for the second substrate 815, and peel off the first substrate 800 by a peeling step. According to this, an ID chip can be transferred to the object such as a substratum of a label or a card and a container of merchandise by one peeling step. Alternately, it is possible to substitute an object to mount an ID chip for the flexible substrate 818. In such a case, an ID chip can be transferred to the object such as a substratum of a label or a card and a container of merchandise by two peeling steps.

An ID tag of the invention is formed over an inexpensive main substrate such as a glass substrate, which can be manufactured at lower cost than the case of a silicon wafer chip. In addition, the silicon wafer chip is obtained by cutting a circular silicon wafer and the shape of its main substrate is limited. On the other hand, the ID tag of the invention employs an insulating substrate such as glass as its main substrate and the shape thereof is not limited. Accordingly, the productivity can be improved and the form and size of an ID tag can be determined arbitrarily.

Furthermore, as for a material of an ID tag, the ID tag of the invention employs a low cost and secure material as compared to a silicon wafer chip. Therefore, a spent ID chip of the invention is not required to be recycled and is environmentally friendly.

In addition, an IC tag formed over a silicon wafer has some problem of a low sensitivity to signals since the silicon wafer may absorb radio waves. In particular, radio waves of 13.56 MHz and 2.45 GHz, that are often used, may be absorbed. On the other hand, the ID tag of the invention formed over an insulating substrate such as glass is preferable since no radio wave is absorbed. Accordingly, a high-sensitive ID tag can be realized, leading to reduction of an antenna area in the ID tag. It contributes to downsizing of the ID tag.

This embodiment mode can be implemented in combination with Embodiment Modes described above.

Embodiment Mode 5

This embodiment mode describes a manufacturing method, in particular, a peeling step which is different from Embodiment Mode 4 of a semiconductor integrated circuit of a semiconductor device of the invention. Identical components such as a thin film transistor are denoted by the same reference numerals as those in Embodiment Mode 4 and description thereof are omitted here.

Figure 14A:
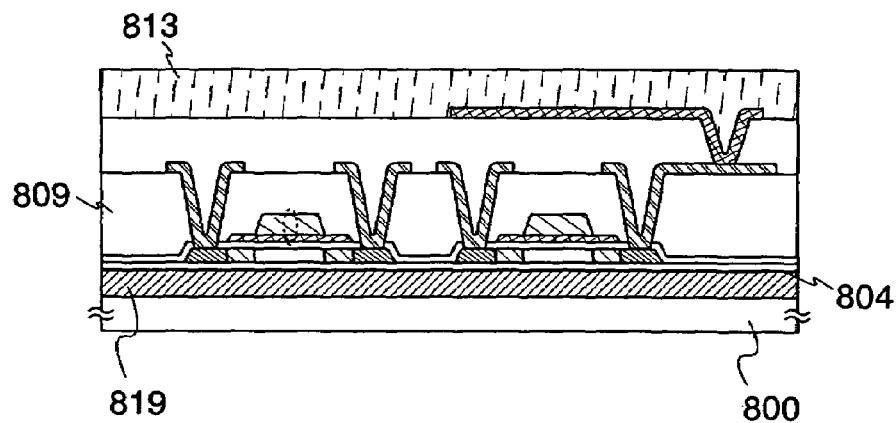
FIGS. 14A to 14D are diagrams illustrating Embodiment Mode 5 of the invention.

As illustrated in FIG. 14A, a peel-off layer 819 is formed over the substrate 800 and a plurality of semiconductor devices each having a semiconductor integrated circuit is formed thereover with the base film 804 interposed therebetween.

A glass substrate, a quartz substrate, a substrate made of an insulating material such as alumina, a silicon wafer substrate, a plastic substrate having enough heat resistance to a process temperature of the subsequent step or the like can be employed as the substrate 800. At this time, a base insulating film for preventing impurity dispersion from the substrate, such as a silicon oxide (SiOx) film, a silicon nitride (SiNx) film, a silicon oxide nitride (SiOxNy) film, a silicon nitride oxide (SiNxOy) film (x>y) (x, y=1, 2 . . . ) may be formed. Alternatively, a metal substrate such as a stainless substrate or a semiconductor substrate with its top surface covered by an insulating film of silicon oxide, silicon nitride, or the like may be employed as the substrate 800.

The peel-off layer 819 is formed between the substrate 800 and the semiconductor integrated circuit. The substrate 800 and the semiconductor integrated circuit are separated from each other by removing the peel-off layer 819. A layer containing silicon as a main component such as amorphous silicon, poly-crystalline silicon, single-crystalline silicon, and semi-amorphous silicon (SAS, micro-crystalline silicon) can be employed as the peel-off layer 819.

Fluorine halide such as $ClF_3$ (chlorine trifluoride) has a characteristic of etching silicon selectively. Therefore, the peel-off layer 819 containing silicon (Si) as a main component can be removed easily by a gas or a liquid containing $ClF_3$.

The base film 804 is formed between the peel-off layer 819 and the semiconductor integrated circuit, and also serves to prevent the semiconductor integrated circuit from being etched by fluorine halide such as $ClF_3$. The fluorine halide such as $ClF_3$ (chlorine trifluoride) has a characteristic of etching silicon selectively, whereas silicon oxide (SiOx), silicon nitride (SiNx), silicon oxide nitride (SiOxNy), or silicon nitride oxide (SiNxOy) are hardly etched. Accordingly, as time passes, the peel-off layer 819 is etched whereas the base film 804 made of silicon oxide, silicon nitride, silicon oxide nitride, or silicon nitride oxide is hardly etched. The semiconductor integrated circuit is prevented from being damaged in this manner.

Note that respective materials of the peel-off layer 819 and the base film 804 are not limited to the above-described ones and they can be selected arbitrarily as long as a material of the peel-off layer 819 is etchable whereas a material of the base film 804 is unetchable by fluorine halide such as $ClF_3$.

Figure 14B:
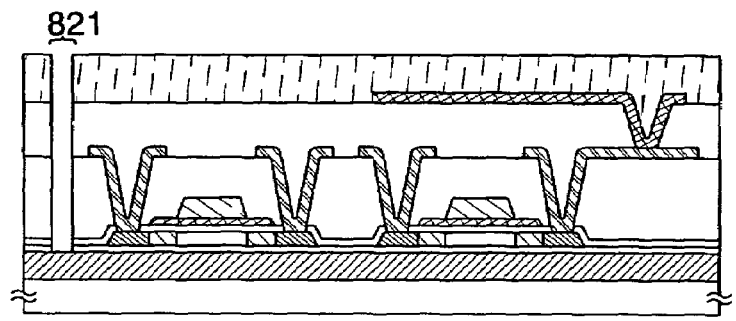

Then, as illustrated in FIG. 14B, a trench 821 is formed at each boundary between the adjacent ID chips.

The trench 821 at each boundary between the adjacent semiconductor integrated circuits can be formed by dicing, scribing, etching with a mask, or the like. In the case of adopting dicing, blade dicing using a dicer is generally adopted. A blade is a rubstone which is made of diamond particles and has a width of about 30 to 50 µm is rapidly rotated to separate the semiconductor integrated circuits from each other. In the case of adopting scribing, diamond scribing, laser scribing, or the like may be adopted. In the case of adopting etching, a mask pattern is formed through exposure and development steps, and then dry etching, wet etching, or the like is carried out to separate the semiconductor integrated circuits from each other. In the dry etching, an atmospheric pressure plasma method may be adopted.

Figure 14C:
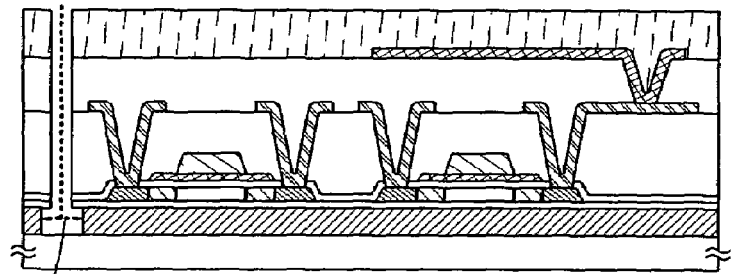

Subsequently, as illustrated in FIG. 14C, a gas or a liquid containing fluorine halide 822 is injected into the trench 821 to remove the peel-off layer 819.

As the fluorine halide, a gas obtained by mixing nitrogen into the $ClF_3$ and the like may be employed. In addition, $ClF_3$ may become liquid (a boiling temperature of 11.75° C.) depending on the temperature of its reaction chamber, and in such a case, wet etching can be adopted as well. Note that $ClF_3$ can be produced by reacting chlorine with fluorine at a temperature of 200° C. or more through $Cl_2$ (gas)+$3F_2$ (gas)→$2 ClF_3$ (gas). An etchant is not limited to using $ClF_3$, or fluorine halide as long as the peel-off layer 819 can be etched whereas the base film 804 is unetched.

Figure 14D:
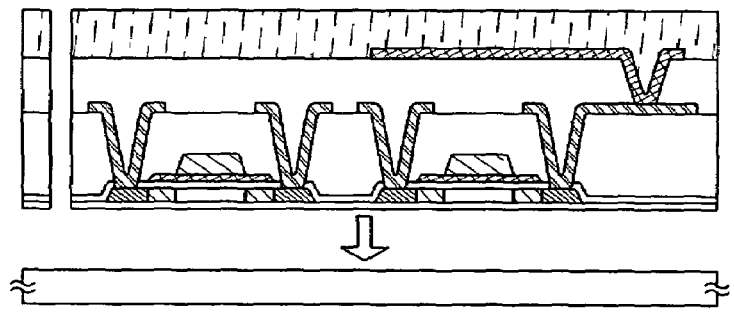

Then, as illustrated in FIG. 14D, the peel-off layer 819 is etched as time passes, so that the substrate 800 is peeled off from the semiconductor integrated circuits. Meanwhile, the base film 804 which is made of silicon oxide, silicon nitride, silicon oxide nitride, silicon nitride oxide, or a heat resistance resin and the interlayer insulating film 809 are hardly etched, so that the semiconductor integrated circuit is prevented from being damaged. The substrate 800 after being peeled off can be reused, which leads to cost reduction. In the case of the substrate 800 to be reused, the dicing or the scribing is preferably carried out while controlling the substrate 800 so as not to be damaged. However, when the substrate 800 is damaged, planarization can be performed to the substrate 800 by forming an organic resin film or an inorganic film by a coating method or a droplet ejection method (an inkjet method).

Note that in order to prevent the semiconductor integrated circuit from being etched by fluorine halide and the like, the passivation layer 813 is preferably formed over the semiconductor integrated circuit. In particular, in the case of adopting etching by using heated fluorine halide, the passivation layer 813 is preferably formed of a heat-resistant organic resin or a heat-resistant inorganic film. The heat-resistant organic resin, namely a so-called siloxane-based resin, is typified by a material in which the skeleton structure is formed by combining silicon and oxygen with each other and at least hydrogen is contained as a substituent, or at least one of fluorine, alkyl, and aromatic hydrocarbon is contained as a substituent.

In this Embodiment, it is possible that a jig is formed over a plurality of the semiconductor integrated circuits with an adhesive material interposed therebetween and a gas or a liquid containing fluorine halide is injected into the trench 821.

The jig is a support substrate for temporarily fixing the semiconductor integrated circuits so that they are not separated from each other after the peel-off layer 819 is removed. The jig is formed per semiconductor integrated circuit configuring one chip or one semiconductor integrated circuit, or per element configured by integrating a plurality of semiconductor integrated circuits in the horizontal direction or in the perpendicular direction. As for the jig, a pectinate structure having projections is preferably adopted in order to inject a gas/liquid containing fluorine halide easily, though a plane jig may be employed. Furthermore, a glass substrate, a quartz substrate, a stainless (SUS) substrate, or the like made of silicon oxide that is not affected by fluorine halide as a main component can be employed, though any material can be employed as long as it is not affected by fluorine halide.

An adhesive material for temporary adhesion is provided between the jig and the semiconductor integrated circuits. As the adhesive material, a material whose adhesion is decreased or lost by UV ray irradiation can be employed. Alternatively, a repeelable and readherable adhesive material may be employed such as products of 3M: Post-it (registered trade mark) and products of Moore USA Inc.:

NOTESTIX (registered trade mark). It is needless to say that any material can be employed as long as the jig can be easily detached.

In this Embodiment, it is possible that a heat-resistant insulating film is formed over a semiconductor integrated circuit and a trench is formed at the boundary between the adjacent semiconductor integrated circuits.

As the heat-resistant insulating film, a heat-resistant organic resin such as a so-called siloxane-based resin which is typified by a material in which the skeleton structure is formed by combining silicon and oxygen with each other and at least hydrogen is contained as a substituent, or at least one of fluorine, alkyl, and aromatic hydrocarbon is contained as a substituent, or a heat-resistant inorganic material can be employed.

According to the peeling method described in this embodiment, a plurality of semiconductor integrated circuits can be certainly peeled off from a substrate by a chemical method using fluorine halide. Therefore, the peeling method described in this embodiment is more preferable as compared with a physical method of adding stress to a substrate to physically peel off a plurality of semiconductor integrated circuits from the substrate.

As described hereinbefore, a metal substrate such as a stainless substrate or a semiconductor substrate with its top surface covered by an insulating film of silicon oxide, silicon nitride, or the like may be employed as the substrate 800. For example, a Si wafer with its top surface covered by a silicon oxide film can be employed as the substrate 800.

Alternatively, a Si wafer over which a silicon oxide film or the like is formed may be employed as the substrate 800. In that case, the Si wafer is etched by fluorine halide such as $ClF_3$ (chlorine trifluoride) to be removed. In addition, single crystalline silicon can be formed over the silicon oxide film or the like, so that a transistor having single crystalline silicon can be obtained.

In the case of the Si wafer being employed, downsizing of a semiconductor integrated circuit can be achieved more easily as compared with the case of a semiconductor integrated circuit being formed over another substrate.

The semiconductor integrated circuit peeled off in this manner can be transferred as is in the aforementioned embodiments.

Embodiment Mode 6

A semiconductor device using the second substrate with the antenna according to Embodiment Mode 4 or Embodiment Mode 5 is described below using FIGS. 16A and 16B.

Figure 16A:
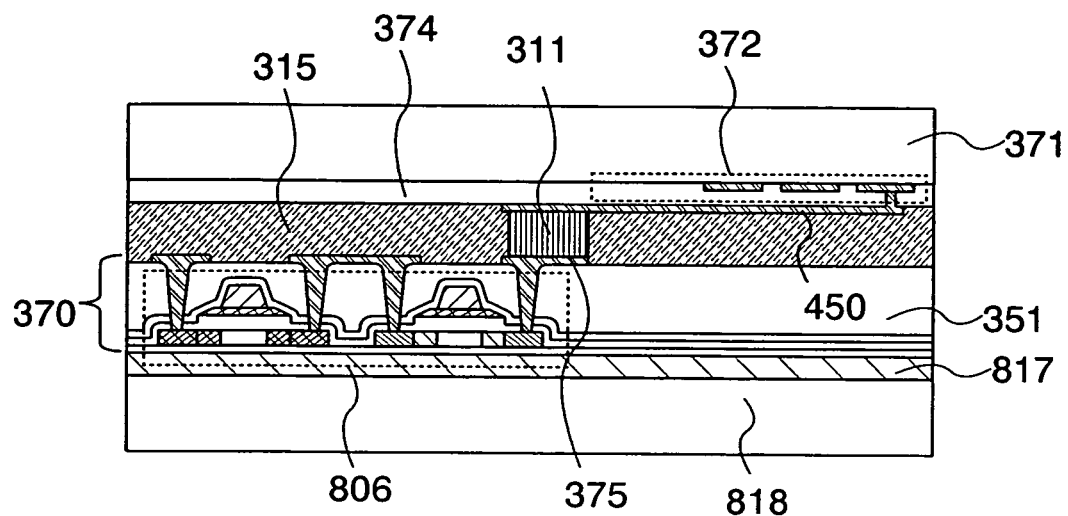
FIGS. 16A and 16B are diagrams illustrating Embodiment Mode 6 of the invention.

According to Embodiment Mode 4 or Embodiment Mode 5, in FIG. 16A, the TFT 806 is provided over the first flexible substrate 818 with the adhesive material 817. An antenna 372 and a pad 450 are formed over a second flexible substrate 371 with an insulating film 374 interposed therebetween. A source electrode or a drain electrode 375 of the TFT 806 in a TFT layer 370 is connected to the pad 450 by the conductive layer 311. In addition, the first flexible substrate 818 and the second flexible substrate 371 are adhered with an adhesive material 315 so that the antenna 372 and the TFT 806 face each other.

Figure 16B:
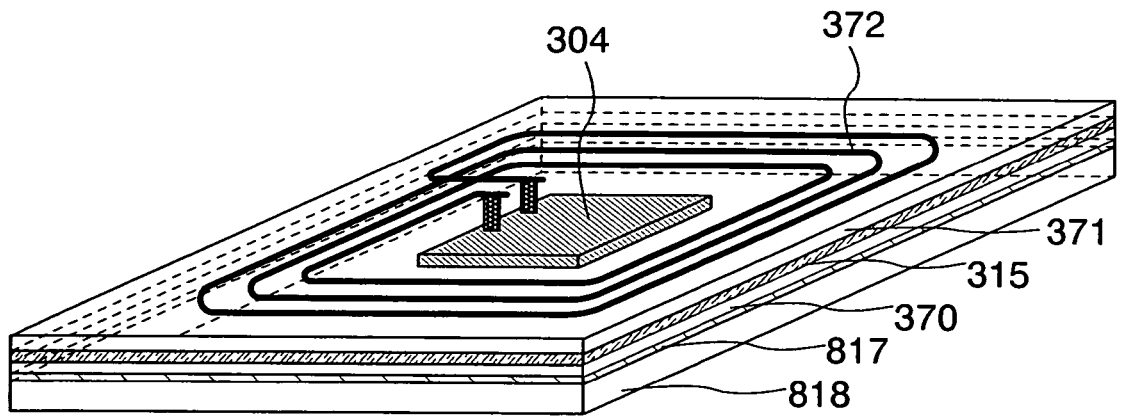

FIG. 16B is a perspective diagram of the semiconductor device in FIG. 16A. A semiconductor integrated circuit configured by the TFT 806, and the antenna 372 which is connected to the semiconductor integrated circuit are provided between the first flexible substrate 818 and the second flexible substrate 371.

Embodiment 1

The invention can be applied to various electronic apparatuses including a TV equipment, a digital camera, a digital video camera, mobile phone set (a mobile phone), a portable information terminal such as a PDA, a portable game machine, a monitor, a notebook personal computer, an audio reproducing device such as an in-car audio system, and an image reproducing device provided with a recording medium such as a home game machine. Specific examples of such electronic apparatuses are described below.

FIG. 10A illustrates a portable terminal which includes a main body 9101 and a display portion 9102. FIG. 10B illustrates a bath TV which includes a main body 9301 and a display portion 9302. FIG. 10C illustrates a portable information terminal which includes a main body 9201 and a display portion 9202. FIG. 10D illustrates a digital video camera which includes display portions 9701.

A panel including the display portion 9102 comprises a driver circuit 9104, a function circuit 9103 such as a CPU and a memory means as illustrated in the right side of FIG. 10A. The invention is applied to a configuration of the memory means in the function circuit 9103. The panel having the function circuit 9103 as well as the driver circuit 9104 can achieve downsizing, lightweight, thin shape of an electronic apparatus since the number of external ICs to be connected is reduced. As for a display element of the display portion, a self luminous light emitting element can realize downsizing, lightweight, thin shape more easily as compared with the case of employing a liquid crystal element because no backlight is required.

FIG. 10E illustrates a contact type IC card which includes a main body 9601, an IC chip 9602, a module terminal 9603. The IC chip 9602 comprises a RAM 9604, a ROM 9605, a CPU 9606, and a RAM 9607. The invention is applied to a configuration of a memory means of the ROM 9605 in the IC chip 9602. This embodiment mode can be implemented in combination with Embodiment Modes described above This application is based on Japanese Patent Application serial no. 2003-423752 filed in Japan Patent Office on 19th, Dec. 2003, the contents of which are hereby incorporated by reference.

What is claimed is:

1. A semiconductor device comprising:
    data storage means having a plurality of memory cells, each of the plurality of memory cells comprising:
        a memory element provided at an intersection of a bit line and a word line, the memory element comprising a first power source line and a second power source line, a transistor having a gate electrode connected to the word line and source and drain regions, one of the source and drain regions connected to the bit line, and another one of the source and drain regions connected to the first power source line or the second power source line; and
    power source control means having a first voltage power source line, a second voltage power source line, a first switch and a second switch, wherein the first switch controls a connection between the first power source line and the first voltage power source line, and the second switch controls a connection between the second power source line and the second voltage power source line.

2. The semiconductor device according to claim 1, wherein the semiconductor device is a masked ROM or a PROM.

3. The semiconductor device according to claim 1, wherein the semiconductor device is an EPROM, an EEPROM, or a flash memory.

4. The semiconductor device according to claim 1, wherein the semiconductor device is one selected from the group consisting of a TV equipment, a digital camera, a digital video camera, a mobile phone set, a portable information terminal, a portable game machine, a monitor, a notebook personal computer, an audio reproducing device, and an image reproducing device provided with a recording medium.

5. The semiconductor device according to claim 1, wherein the semiconductor device is an IC card.

6. A semiconductor device comprising:
data storage means having a plurality of memory cells, each of the plurality of memory cells comprising:
  a memory element provided at an intersection of a bit line and a word line, the memory element comprising a first power source line and a second power source line, a transistor having a gate electrode connected to the word line and source and drain regions, one of the source and drain regions connected to the bit line, and another one of the source and drain regions connected to the first power source line or the second power source line; and
power source control means having a first voltage power source line, a second voltage power source line, a first switch and a second switch, wherein the first switch controls a connection between the first power source line and the first voltage power source line, and the second switch controls a connection between the second power source line and the second voltage power source line; and
address selection means comprising:
  a selector circuit having a plurality of switches, each controlling a connection between an output bus and the bit line;
  a first decoder circuit supplying a signal to the selector circuit and the power control means; and
  a second decoder circuit connecting to the word line.

7. The semiconductor device according to claim 6, wherein the semiconductor device is a masked ROM or a PROM.

8. The semiconductor device according to claim 6, wherein the semiconductor device is an EPROM, an EEPROM, or a flash memory.

9. The semiconductor device according to claim 6, wherein the semiconductor device is one selected from the group consisting of a TV equipment, a digital camera, a digital video camera, a mobile phone set, a portable information terminal, a portable game machine, a monitor, a notebook personal computer, an audio reproducing device, and an image reproducing device provided with a recording medium.

10. The semiconductor device according to claim 6, wherein the semiconductor device is an IC card.

11. A semiconductor device comprising:
data storage means having a plurality of memory cells, each of the plurality of memory cells comprising:
  a memory element provided at an intersection of a bit line and a word line, the memory element comprising a transistor having a gate electrode connected to the word line and source and drain regions, one of the source and drain regions connected to the bit line, and another one of the source and drain regions connected to a power source line; and
power source control means having switches, each of the switches controlling a connection between the power source line and a voltage power source line; and
address selection means comprising:
  a selector circuit having a plurality of switches, each controlling a connection between an output bus and the bit line;
  a first decoder circuit supplying a signal to the selector circuit and the power control means; and
  a second decoder circuit connecting to the word line; and
precharge means connecting to the bit line.

12. The semiconductor device according to claim 11, wherein the semiconductor device is a masked ROM or a PROM.

13. The semiconductor device according to claim 11, wherein the semiconductor device is an EPROM, an EEPROM, or a flash memory.

14. The semiconductor device according to claim 11, wherein the semiconductor device is one selected from the group consisting of a TV equipment, a digital camera, a digital video camera, a mobile phone set, a portable information terminal, a portable game machine, a monitor, a notebook personal computer, an audio reproducing device, and an image reproducing device provided with a recording medium.

15. The semiconductor device according to claim 11, wherein the semiconductor device is an IC card.

16. A semiconductor device comprising:
data storage means having a plurality of memory cells, each of the plurality of memory cells comprising:
  a memory element provided at an intersection of a bit line and a word line, the memory element comprising a transistor having a gate electrode connected to the word line and source and drain regions, one of the source and drain regions connected to the bit line, and another one of the source and drain regions connected to a power source line; and
power source control means having switches, each of the switches controlling a connection between the power source line and a voltage power source line; and
display means having a pixel supplied with a video signal stored in the data storage means through a CPU.

17. The semiconductor device according to claim 16, wherein the semiconductor device is a masked ROM or a PROM.

18. The semiconductor device according to claim 16, wherein the semiconductor device is an EPROM, an EEPROM, or a flash memory.

19. The semiconductor device according to claim 16, wherein the semiconductor device is one selected from the group consisting of a TV equipment, a digital camera, a digital video camera, a mobile phone set, a portable information terminal, a portable game machine, a monitor, a notebook personal computer, an audio reproducing device, and an image reproducing device provided with a recording medium.

20. The semiconductor device according to claim 16, wherein the semiconductor device is an IC card.

21. A semiconductor device comprising:
data storage means having a plurality of memory cells, each of the plurality of memory cells comprising:
  a memory element provided at an intersection of a bit line and a word line, the memory element comprising a transistor having a gate electrode connected to the word line and source and drain regions, one of the source and drain regions connected to the bit line, and another one of the source and drain regions connected to a power source line; and power source control means having switches, each of the switches controlling a connection between the power source line and a voltage power source line; and address selection means comprising:
- a selector circuit having a plurality of switches, each controlling a connection between an output bus and the bit line;
- a first decoder circuit supplying a signal to the selector circuit and the power control means; and
- a second decoder circuit connecting to the word line; and display means having a pixel supplied with a video signal stored in the data storage means through a CPU.

22. The semiconductor device according to claim 21, wherein the semiconductor device is a masked ROM or a PROM.

23. The semiconductor device according to claim 21, wherein the semiconductor device is an EPROM, an EEPROM, or a flash memory.

24. The semiconductor device according to claim 21, wherein the semiconductor device is one selected from the group consisting of a TV equipment, a digital camera, a digital video camera, a mobile phone set, a portable information terminal, a portable game machine, a monitor, a notebook personal computer, an audio reproducing device, and an image reproducing device provided with a recording medium.

25. The semiconductor device according to claim 21, wherein the semiconductor device is an IC card.

26. An ID tag comprising:

data storage means having a plurality of memory cells, each of the plurality of memory cells comprising:
- a memory element provided at an intersection of a bit line and a word line, the memory element comprising a transistor having a gate electrode connected to the word line and source and drain regions, one of the source and drain regions connected to the bit line, and another one of the source and drain regions connected to a power source line; and power source control means having switches, each of the switches controlling a connection between the power source line and a voltage power source line; and address selection means comprising:
- a selector circuit having a plurality of switches, each controlling a connection between an output bus and the bit line;
- a first decoder circuit supplying a signal to the selector circuit and the power control means; and
- a second decoder circuit connecting to the word line;

control means signalizing data in the data storage means;

an antenna transmitting the signalized data, and receiving a signal;

power source generation means generating electromotive force from the received signal, and supplying the electromotive force to the control means.

* * * * *